(12) United States Patent
Hong et al.

(10) Patent No.: US 8,790,998 B2
(45) Date of Patent: Jul. 29, 2014

(54) METHOD OF FORMING CORE-SHELL TYPE STRUCTURE AND METHOD OF MANUFACTURING TRANSISTOR USING THE SAME

(75) Inventors: Ki-ha Hong, Seoul (KR); Kyoung-won Park, Seoul (KR); Jai-kwang Shin, Anyang-si (KR); Jong-seob Kim, Suwon-si (KR); Hyuk-soon Choi, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 570 days.

(21) Appl. No.: 12/588,828

(22) Filed: Oct. 29, 2009

(65) Prior Publication Data

US 2010/0151659 A1 Jun. 17, 2010

(30) Foreign Application Priority Data

Dec. 16, 2008 (KR) ........................ 10-2008-0128183

(51) Int. Cl.
| | | |
|---|---|---|
| H01L 21/302 | (2006.01) | |
| H01L 21/336 | (2006.01) | |
| H01L 21/84 | (2006.01) | |
| H01L 21/20 | (2006.01) | |
| H01L 29/12 | (2006.01) | |
| H01L 29/786 | (2006.01) | |
| H01L 29/78 | (2006.01) | |
| H01L 29/66 | (2006.01) | |

(52) U.S. Cl.
CPC ............ *H01L 29/125* (2013.01); *H01L 29/127* (2013.01); *H01L 29/78696* (2013.01); *H01L 29/785* (2013.01); *H01L 29/78618* (2013.01); *H01L 29/66795* (2013.01)
USPC .......................................... 438/479; 438/151; 438/703; 257/E21.09; 257/E21.7; 257/E29.04; 257/E29.051; 257/E29.052

(58) Field of Classification Search
CPC ... H01L 29/122; H01L 29/125; H01L 29/127; H01L 29/78696; H01L 29/66795; H01L 29/785; H01L 29/78618; B82Y 10/00
USPC .......... 977/762, 938, 765, 888; 438/479, 703, 438/151; 257/E21.09, E21.7, E29.04, 257/E29.05, E29.051, E29.052
See application file for complete search history.

(56) References Cited

U.S. PATENT DOCUMENTS

| 5,612,546 A | * | 3/1997 | Choi et al. | .................... | 257/66 |
| 5,844,279 A | * | 12/1998 | Tanamoto et al. | ............ | 257/347 |

(Continued)

FOREIGN PATENT DOCUMENTS

| JP | 2004-122283 | 4/2004 |
| JP | 2005-125428 | 5/2005 |

(Continued)

OTHER PUBLICATIONS

Fang Qian, et al., "Core/Multishell Nanowire Heterostructures as Multicolor, High-Efficiency Light-Emitting Diodes," Nano Letters, vol. 5, No. 11, pp. 2287-2291 (2005).

(Continued)

*Primary Examiner* — Mary Wilczewski
(74) *Attorney, Agent, or Firm* — Harness, Dickey & Pierce, P.L.C.

(57) ABSTRACT

Example embodiments relate to a method of forming a core-shell structure. According to a method, a region in which the core-shell structure will be formed is defined on a substrate, and a core and a shell layer may be sequentially stacked in the defined region. A first shell layer may further be formed between the substrate and the core. When the core and the shell layer are sequentially stacked in the core-shell region, the method may further include forming a groove on the substrate, forming the first shell layer covering surfaces of the groove, forming the core in the groove of which surfaces are covered by the first shell layer, and forming a second shell layer covering the core.

20 Claims, 27 Drawing Sheets

(56) References Cited

U.S. PATENT DOCUMENTS

| | | | |
|---|---|---|---|
| 6,198,113 B1* | 3/2001 | Grupp | 257/39 |
| 6,566,704 B2* | 5/2003 | Choi et al. | 257/314 |
| 6,740,910 B2* | 5/2004 | Roesner et al. | 257/213 |
| 6,833,567 B2* | 12/2004 | Choi et al. | 257/135 |
| 6,852,582 B2* | 2/2005 | Wei et al. | 438/195 |
| 6,855,603 B2* | 2/2005 | Choi et al. | 438/268 |
| 6,897,098 B2* | 5/2005 | Hareland et al. | 438/128 |
| 6,962,839 B2* | 11/2005 | Wei et al. | 438/195 |
| 6,972,467 B2* | 12/2005 | Zhang et al. | 257/401 |
| 7,001,805 B2* | 2/2006 | Wang et al. | 438/197 |
| 7,015,546 B2* | 3/2006 | Herr et al. | 257/345 |
| 7,041,539 B2* | 5/2006 | Fraboulet et al. | 438/158 |
| 7,064,372 B2* | 6/2006 | Duan et al. | 257/296 |
| 7,067,867 B2* | 6/2006 | Duan et al. | 257/296 |
| 7,087,920 B1* | 8/2006 | Kamins | 257/2 |
| 7,102,157 B2* | 9/2006 | Kastalsky et al. | 257/40 |
| 7,105,428 B2* | 9/2006 | Pan et al. | 438/584 |
| 7,105,874 B2* | 9/2006 | Chae et al. | 257/213 |
| 7,129,554 B2* | 10/2006 | Lieber et al. | 257/414 |
| 7,135,728 B2* | 11/2006 | Duan et al. | 257/296 |
| 7,145,246 B2* | 12/2006 | Hareland et al. | 257/775 |
| 7,176,478 B2* | 2/2007 | Kastalsky et al. | 257/9 |
| 7,211,464 B2* | 5/2007 | Lieber et al. | 438/99 |
| 7,233,041 B2* | 6/2007 | Duan et al. | 257/296 |
| 7,238,594 B2* | 7/2007 | Fonash et al. | 438/478 |
| 7,245,520 B2* | 7/2007 | Bertin et al. | 365/151 |
| 7,254,151 B2* | 8/2007 | Lieber et al. | 372/44.01 |
| 7,262,501 B2* | 8/2007 | Duan et al. | 257/750 |
| 7,273,732 B2* | 9/2007 | Pan et al. | 435/99 |
| 7,307,271 B2* | 12/2007 | Islam et al. | 257/14 |
| 7,330,709 B2* | 2/2008 | Bertin | 455/335 |
| 7,339,184 B2* | 3/2008 | Romano et al. | 257/1 |
| 7,385,231 B2* | 6/2008 | Fujimoto et al. | 257/121 |
| 7,390,947 B2* | 6/2008 | Majumdar et al. | 257/27 |
| 7,391,074 B2* | 6/2008 | Cohen | 257/316 |
| 7,436,033 B2* | 10/2008 | Park et al. | 257/401 |
| 7,446,025 B2* | 11/2008 | Cohen et al. | 438/583 |
| 7,446,044 B2* | 11/2008 | Kaul et al. | 438/684 |
| 7,465,595 B2* | 12/2008 | Song et al. | 438/46 |
| 7,485,908 B2* | 2/2009 | Anwar et al. | 257/296 |
| 7,535,014 B2* | 5/2009 | Hsu et al. | 257/9 |
| 7,538,337 B2* | 5/2009 | Hijzen et al. | 257/3 |
| 7,542,334 B2* | 6/2009 | Bertin et al. | 365/156 |
| 7,586,130 B2* | 9/2009 | Kawashima et al. | 257/135 |
| 7,687,308 B2* | 3/2010 | Parikh et al. | 438/99 |
| 7,700,419 B2* | 4/2010 | Anwar et al. | 438/151 |
| 7,736,979 B2* | 6/2010 | Farrow et al. | 438/270 |
| 7,749,784 B2* | 7/2010 | Lin | 438/34 |
| 7,749,905 B2* | 7/2010 | Cohen et al. | 438/682 |
| 7,772,125 B2* | 8/2010 | Kawashima et al. | 438/701 |
| 7,842,955 B2* | 11/2010 | Parikh et al. | 257/77 |
| 7,884,004 B2* | 2/2011 | Bangsaruntip et al. | 438/586 |
| 7,893,476 B2* | 2/2011 | Verhulst | 257/296 |
| 7,897,458 B2* | 3/2011 | Lee et al. | 438/260 |
| 8,004,018 B2* | 8/2011 | Ermolov | 257/213 |
| 8,034,315 B2* | 10/2011 | Sinha et al. | 423/447.1 |
| 8,217,386 B2* | 7/2012 | Rinzler et al. | 257/40 |
| 8,441,043 B2* | 5/2013 | Bangsaruntip et al. | 257/213 |
| 8,445,948 B2* | 5/2013 | Fuller et al. | 257/288 |
| 8,450,724 B2* | 5/2013 | Sone et al. | 257/40 |
| 8,455,334 B2* | 6/2013 | Bangsaruntip et al. | 438/479 |
| 8,492,208 B1* | 7/2013 | Cohen et al. | 438/151 |
| 8,569,900 B2* | 10/2013 | Quitoriano et al. | 257/798 |
| 2005/0079659 A1* | 4/2005 | Duan et al. | 438/197 |
| 2008/0237871 A1* | 10/2008 | Madakasira et al. | 257/768 |
| 2008/0266556 A1* | 10/2008 | Kamins et al. | 356/301 |
| 2009/0291311 A1* | 11/2009 | Chew et al. | 428/409 |
| 2010/0151659 A1* | 6/2010 | Hong et al. | 438/478 |
| 2010/0193770 A1* | 8/2010 | Bangsaruntip et al. | 257/24 |
| 2010/0261013 A1* | 10/2010 | Duan et al. | 428/384 |
| 2011/0147697 A1* | 6/2011 | Shah et al. | 257/9 |
| 2011/0169012 A1* | 7/2011 | Hersee et al. | 257/76 |
| 2011/0248243 A1* | 10/2011 | Chen et al. | 257/29 |
| 2011/0253981 A1* | 10/2011 | Rooyackers et al. | 257/24 |
| 2011/0260775 A1* | 10/2011 | Burki et al. | 327/434 |
| 2011/0278543 A1* | 11/2011 | Bangsaruntip et al. | 257/24 |
| 2011/0278544 A1* | 11/2011 | Bangsaruntip et al. | 257/24 |
| 2012/0202345 A1* | 8/2012 | Fletcher et al. | 438/664 |
| 2013/0292701 A1* | 11/2013 | Bangsaruntip et al. | 257/77 |
| 2013/0328116 A1* | 12/2013 | Chang et al. | 257/301 |
| 2014/0034905 A1* | 2/2014 | Bangsaruntip et al. | 257/24 |

FOREIGN PATENT DOCUMENTS

| | | |
|---|---|---|
| JP | 2007-294908 | 11/2007 |
| KR | 10-2003-0068029 | 8/2003 |
| KR | 10-0594327 | 6/2006 |
| KR | 10-2006-0128620 | 12/2006 |
| KR | 10-2007-0059162 | 6/2007 |
| KR | 10-2007-0102633 | 10/2007 |

OTHER PUBLICATIONS

Jie Xiang, et al., "Ge/Si nanowire heterostructures as high-performance field-effect transistors," Nature Publishing Group, vol. 441, pp. 489-493, May 25, 2006.

Yong Zhang, et al., "Quantum Coaxial Cables" for Solar Energy Harvesting, Nano Letters, vol. 7, No. 5, pp. 1264-1269 (2007).

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

METHOD OF FORMING CORE-SHELL TYPE STRUCTURE AND METHOD OF MANUFACTURING TRANSISTOR USING THE SAME

CROSS-REFERENCE TO RELATED APPLICATION

This application claims priority under 35 U.S.C. §119 to Korean Patent Application No. 10-2008-0128183, filed on Dec. 16, 2008 with the Korean Intellectual Property Office, the disclosure of which is incorporated herein in its entirety by reference.

BACKGROUND

1. Field

Example embodiments relate to a method of forming a structure which may be used as a component of a semiconductor device and a method of manufacturing a semiconductor device by using such a method of forming.

2. Description of the Related Art

In a conventional core-shell structure, the core is surrounded by a shell. A difference in valence electron band energy exists between a material constituting the core and a material constituting the shell. As a result, a quantum well is formed in the core. Such a core-shell structure may be used as a channel, and carriers may exist within the quantum well of the core. Thus, the dispersion of carriers may be reduced at the surface of a gate oxide film when carriers move through a channel. Consequently, carrier mobility may be improved. However, conventional core-shell structures are formed using a bottom-up method, thereby rendering it relatively difficult to form a core-shell structure in a desired region. Additionally, if a core-shell structure is used as a channel, it may be difficult to adjust the length of the channel and the thickness of a film in the core-shell structure, thereby rendering commercialization more difficult. Furthermore, although the conventional bottom-up method may be used to mass-produce core-shell structures, it is still relatively difficult to mass-produce core-shell structures that have been aligned for a particular purpose.

SUMMARY

Example embodiments relate to a method of forming a core-shell structure having a desired shape at a desired location. Example embodiments also relate to a method of manufacturing a transistor that uses the method of forming the core-shell structure.

A method of forming a core-shell structure according to example embodiments may include defining a core-shell region on a substrate, the core-shell region being an area where the core-shell structure will be formed; and sequentially stacking a core and an upper shell layer in the core-shell region of the substrate.

When the upper shell layer is a second shell layer, a first shell layer (e.g., lower shell layer) may be formed between the substrate and the core. The method may further include forming a groove in the substrate, forming the first shell layer on the substrate such that the first shell layer covers surfaces of the groove to form a coated groove, forming the core in the coated groove, and forming the second shell layer to cover the core. Forming the core may include forming a core layer on the first/lower shell layer so as to fill the coated groove, and removing the core layer so as to leave a portion of the core layer in the coated groove.

The method may further include sequentially etching the upper shell layer, the lower shell layer, and a silicon layer of the substrate to form a core-shell structure, wherein the substrate is a silicon-on-insulator (SOI) substrate and the groove is formed in the silicon layer. Sharp corners of the resultant core-shell structure may be removed.

The sequential stacking of the core and the upper shell layer in the core-shell region of the substrate may include forming a groove in the substrate, forming the core in the groove, and forming the upper shell layer to cover the core. Forming the core may include forming a core layer on the substrate so as to fill the groove, and removing the core layer so as to leave a portion of the core layer in the groove. The method may further include sequentially etching the upper shell layer and a silicon layer of the substrate to form a core-shell structure, wherein the substrate is a SOI substrate and the groove is formed in the silicon layer. The thickness of the lower shell layer may be about one-third of the width of the groove. Furthermore, the width of the groove may be the same as the width of the core.

The sequential stacking of the core and the upper shell layer in the core-shell region of the substrate may also include forming a core layer on the substrate, forming the upper shell layer on the core layer, forming a mask on the upper shell layer, the mask being larger than the core-shell region, removing the upper shell layer and the core layer surrounding the mask, and removing the mask. The method may further include reducing a width of a silicon layer of the substrate and a width of the upper shell layer, wherein the substrate is a SOI substrate and the width of the upper shell layer is greater than a diameter of the core and smaller than the width of the silicon layer. The core may be formed from the core layer after the width of the silicon layer and the width of the upper shell layer are reduced. Exposed surfaces of the core may be covered with an outer shell layer. The core and the shell of the core-shell structure may be respectively formed of Ge and Si, GaAs and InGaAs, or InAs and InP.

A method of manufacturing a semiconductor device having a core-shell structure may include forming a groove in a substrate, filling the groove with a core layer, defining contiguous first, second, and third regions on the core layer and processing the second region to form the core of the core-shell structure, and exposing top surfaces of the first and third regions of the core layer and forming the core-shell structure by surrounding the core with a shell layer.

The method may further include forming an insulation layer to cover the core-shell structure while leaving the first, second, and third regions of the core layer exposed, and forming electrodes on at least a portion of the first, second, and third regions. Forming the core-shell structure may include forming a top shell layer to cover the core layer, forming a mask to define a region on the top shell layer where the core-shell structure will be formed, removing the top shell layer and a silicon layer of the substrate surrounding the mask, the substrate being a SOI substrate, removing the mask, and removing the top shell layer on the first, second, and third regions. The semiconductor device may be an electric field-effect transistor in which the core surrounded by the shell layer operates as a channel.

BRIEF DESCRIPTION OF THE DRAWINGS

The above and/or other aspects of example embodiments may become more apparent and readily appreciated when the following description is taken in conjunction with the accompanying drawings of which.

DETAILED DESCRIPTION

Figure 1:
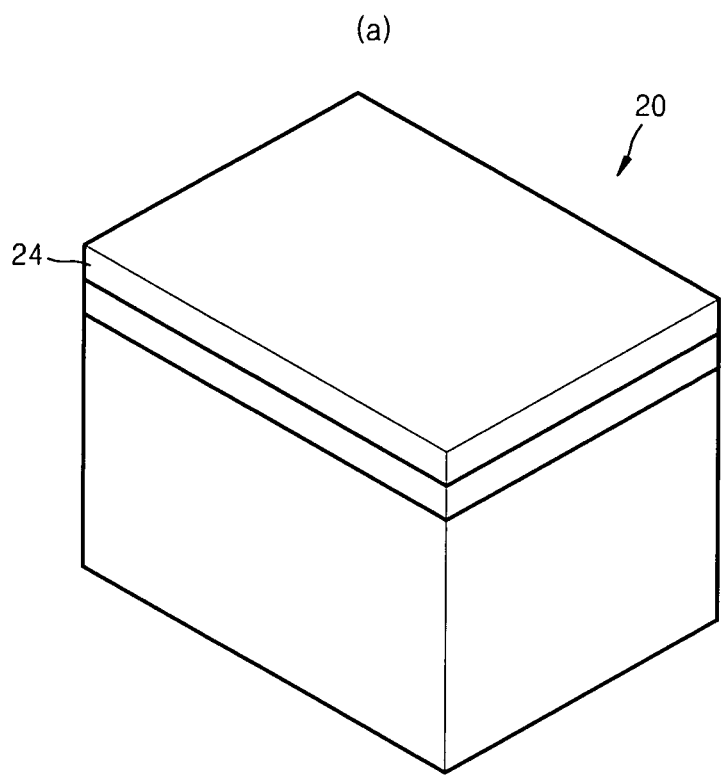
FIGS. 1 through 9 are perspective and cross-sectional views of a method of forming a core-shell structure according to example embodiments.
Figure 1:
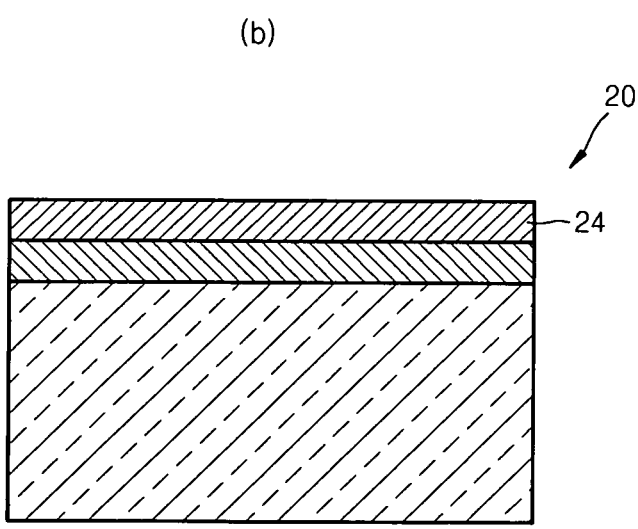

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, a method of forming a core-shell type structure according to example embodiments will be described in further detail with reference to the accompanying drawings. Furthermore, a method of manufacturing a transistor including a core-shell type structure according to example embodiments will also be described in further detail with reference to the accompanying drawings.

Figure 2:
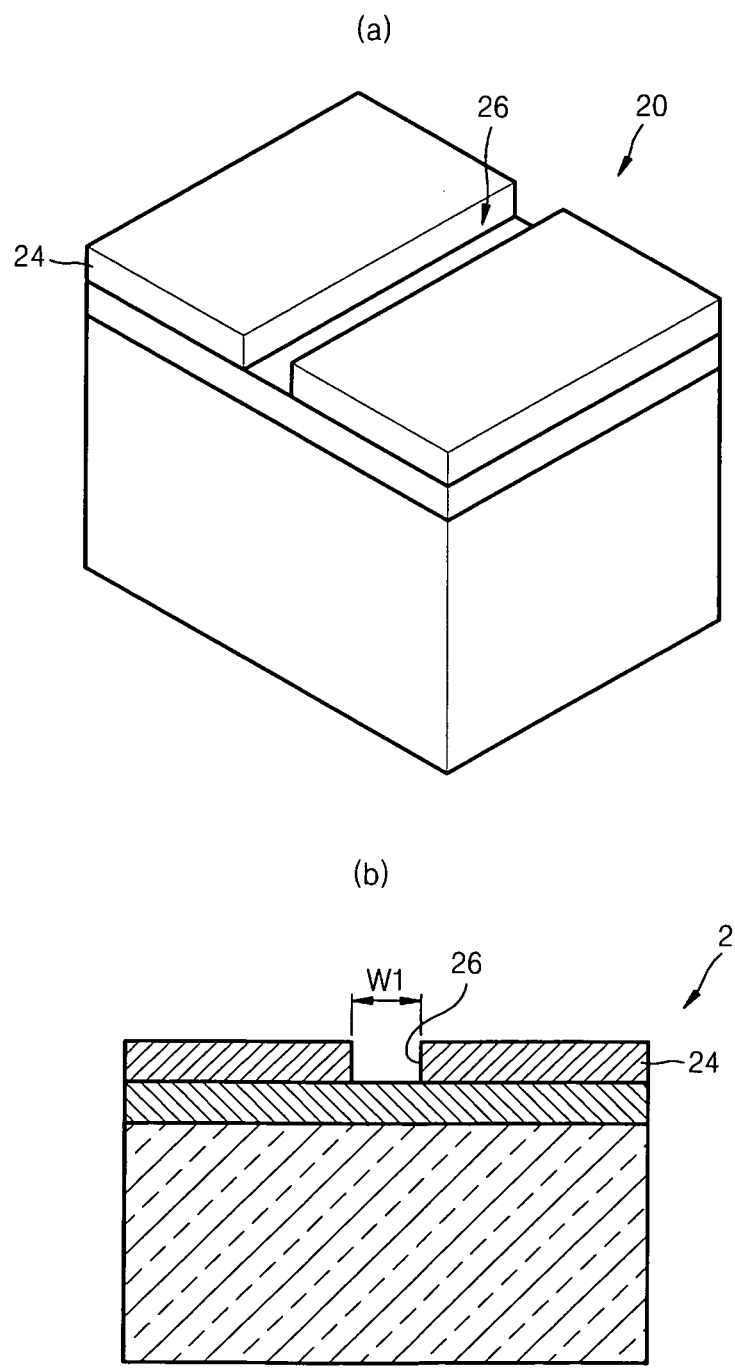

Referring to FIG. 1, a silicon-on-insulator (SOI) substrate 20 may be prepared. Referring to FIG. 2, a groove 26 may be formed with a predetermined depth in a silicon layer 24 of the SOI substrate 20. The groove 26 may be formed using a photographing method or an etching method used in semiconductor fabricating operations. The groove 26 may also be formed using other methods, e.g. a nano imprinting method. The shape and the size of a core (reference numeral 34 in FIG. 6), which will be formed in a later operation, may be decided based on the width W1 of the groove 26 and the thickness of a shell layer, which will be deposited in the groove 26 in a later operation. Therefore, the width W1 of the groove 26 may be set by considering the thickness of the shell layer to be deposited in the groove 26. For example, if the thickness of a first shell layer (28 in FIG. 3) to be deposited in the groove 26 is approximately one-third of the width W1 of the groove 26, a core having an appropriate shape (a shape having a circular cross-section or a cross-section similar to a circle) may be formed. Thus, if the width W1 of the groove 26 is, for example, approximately 30 nm, and the thickness of the shell layer (28 in FIG. 3), which will be formed in a later operation, is approximately from about 8 nm to about 11 nm, a core which will be formed in the groove 26 thereafter may have the appropriate shape described above.

Figure 3:
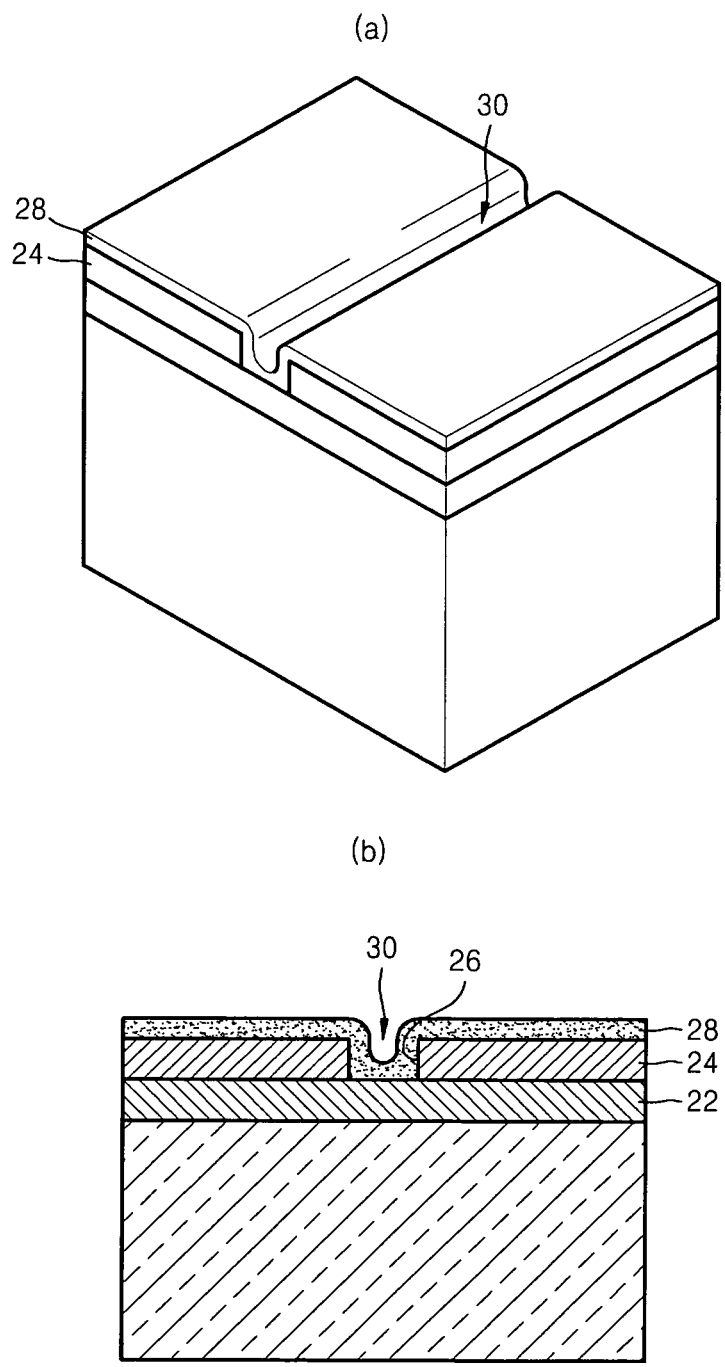

Referring to FIG. 3, the first shell layer 28, which covers the side surfaces and the bottom surface of the groove 26 with the predetermined depth, may be formed on the silicon layer 24. The first shell layer 28 may be a material layer having a different valence electron band energy than a core layer which will be formed in a later operation. The first shell layer 28 may be an electrically conductive material layer. For example, the first shell layer 28 may be a semiconductor layer, e.g. a silicon layer. Alternatively, the first shell layer 28 may be a compound semiconductor layer, e.g. an InGaAs layer, an AlGaAs layer, an InP layer, a ZnS layer, an AlGaN layer, or a MgZnO layer. As the first shell layer 28 is deposited in the groove 26, the groove 26 is reduced to a groove 30 (hereinafter referred to as a core groove 30). The size of the cross-section of the core groove 30 corresponds to the size of a core which will be formed in a later operation. Thus, since the size of a core which will be formed in a later operation may be determined by the deposition of the first shell layer 28, the thickness of the first shell layer 28 may be decided by considering the desired size of the core.

Figure 4:
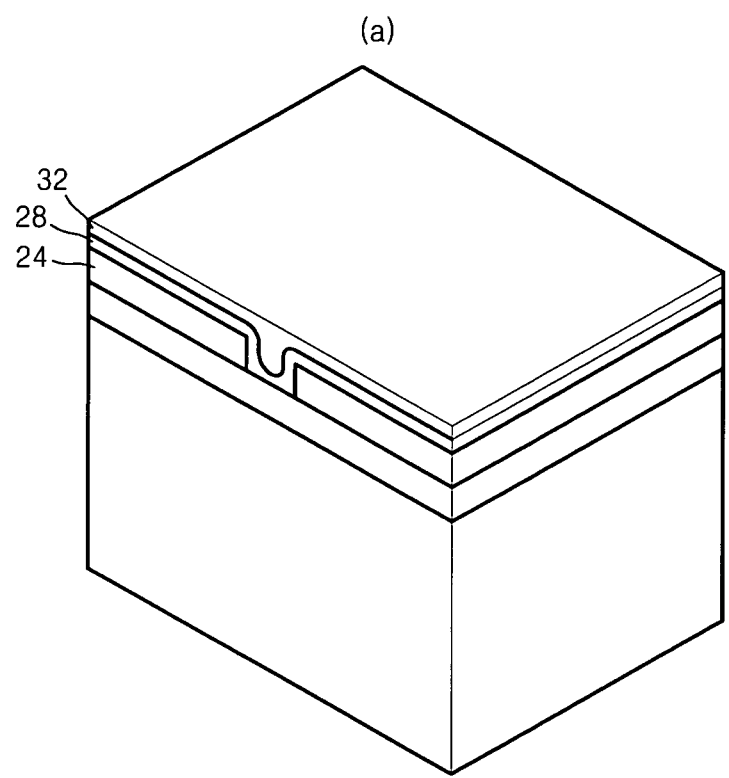
Figure 4:
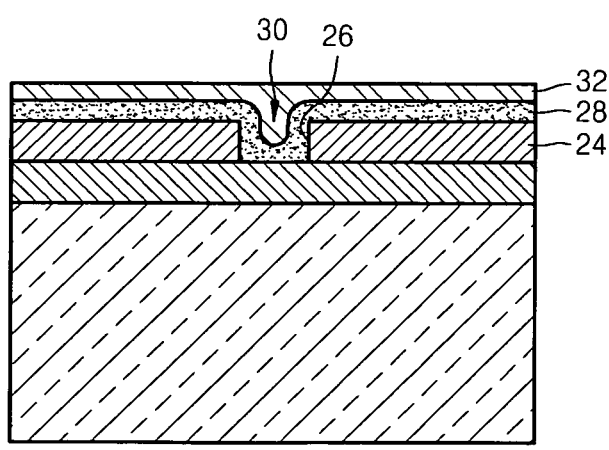
Figure 5:
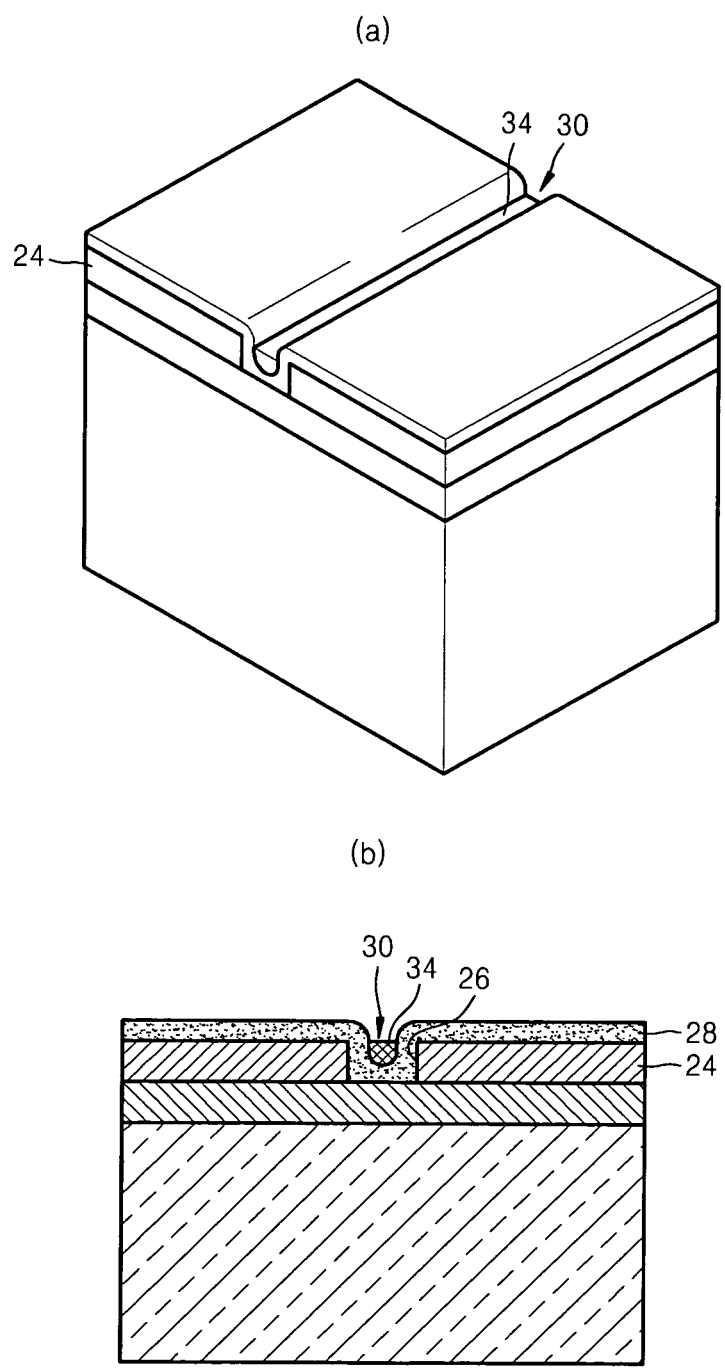

Referring to FIG. 4, a core layer 32, which is filled in the core groove 30, may be formed on the first shell layer 28. The core layer 32 may be a material layer having a different valence electron band energy from the first shell layer 28. The core layer 32 may also be an electrically conductive material layer. Furthermore, the core layer 32 may be a semiconductor layer or a compound semiconductor layer. For example, the core layer 32 may be a Ge layer, a GaAs layer, an InAs layer, a ZnO layer, a ZnSe layer, or a GaN layer. After the core layer 32 is formed, the top surface of the core layer 32 is etched. At this point, the top surface of the core layer 32 may be etched by using an etchant with high etching selectivity with respect to the first shell layer 28 until the top surface of the first shell layer 28 is exposed. After the top surface of the first shell layer 28 is exposed, the etching may be performed until the core layer 32 formed over the core groove 30 is removed. As a result, the core layer 32 remains only within the core groove 32 as shown in FIG. 5. The portion of the core layer 32 remaining within the core groove 30 will be hereinafter referred to as the core 34.

Figure 6:
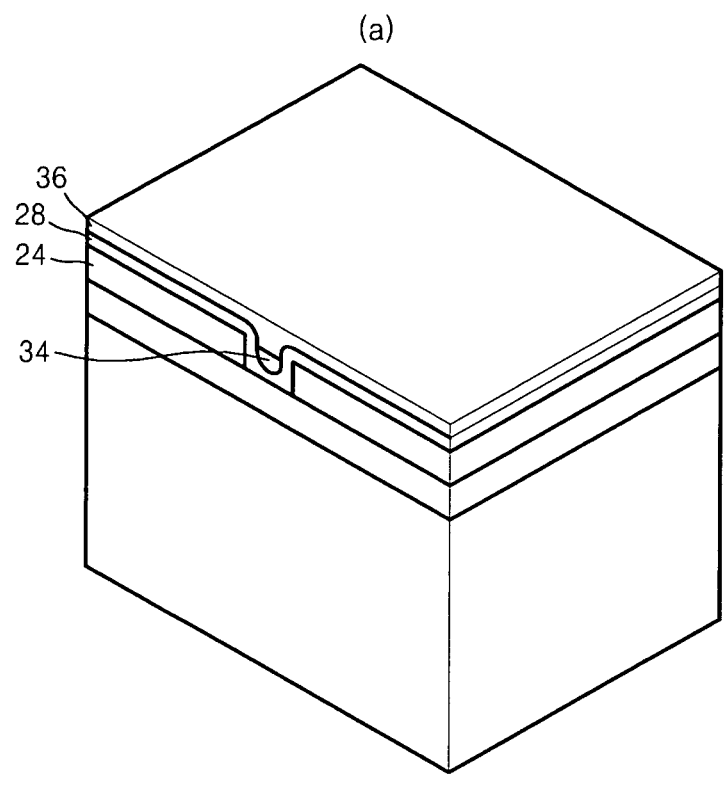
Figure 6:
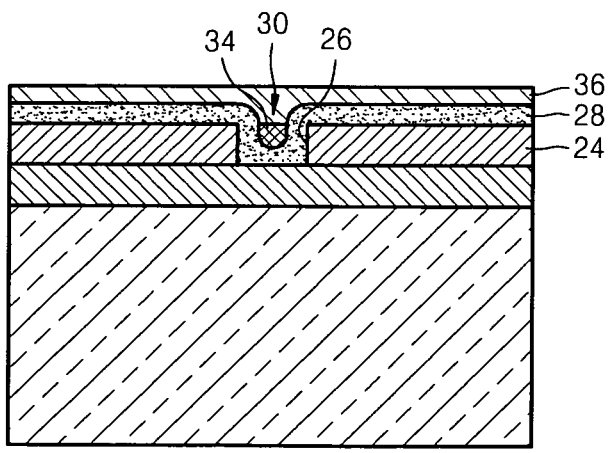

Referring to FIGS. 5 and 6, a second shell layer 36, which is filled in the core groove 30 and covers the core 34, may be formed on the first shell layer 28. The top surface of the second shell layer 36 may be planarized. The first shell layer 28 and the second shell layer 36 may be formed of the same material. As the second shell layer 36 is formed, the core 34 may be completely surrounded by the shell layers.

Figure 7:
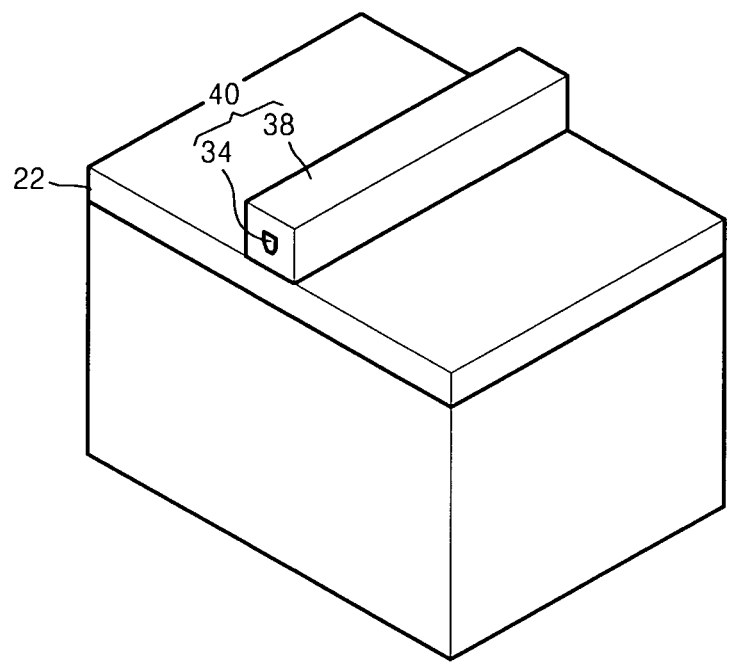
Figure 7:
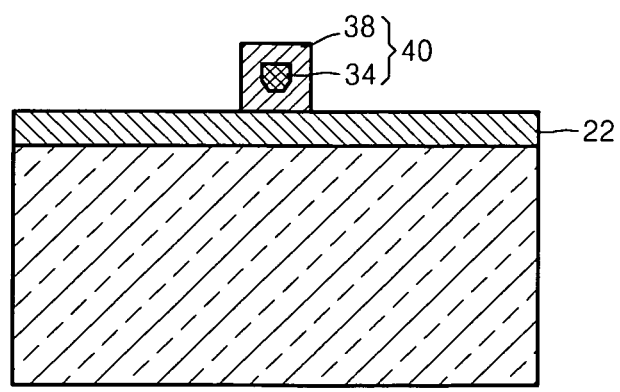

Referring to FIGS. 6 and 7, a mask (not shown) defining the core 34 and a region surrounding the core 34 may be formed on the second shell layer 36. The mask defines a region in which a core-shell structure will be formed. Accordingly, the location and the shape of a core-shell structure to be formed may be determined using the mask, and thus a core-shell structure having a desired shape may be formed at a desired location. After the mask is formed, portions of the second shell layer 36, the first shell layer 28, and the silicon layer 24 surrounding the mask are sequentially etched. After the etching operation, the mask is removed. The etching operation may be performed until an insulation layer 22 of the SOI substrate 20 is exposed. The etching operation using the mask may be a photographing operation or an etching operation used in conventional semiconductor fabricating operations. As a result of the etching operation, a core-shell structure 40, which has a given length and includes the core 34 and a shell layer 38 surrounding the core 34, may be formed at a desired location on the insulation layer 22.

Figure 8:
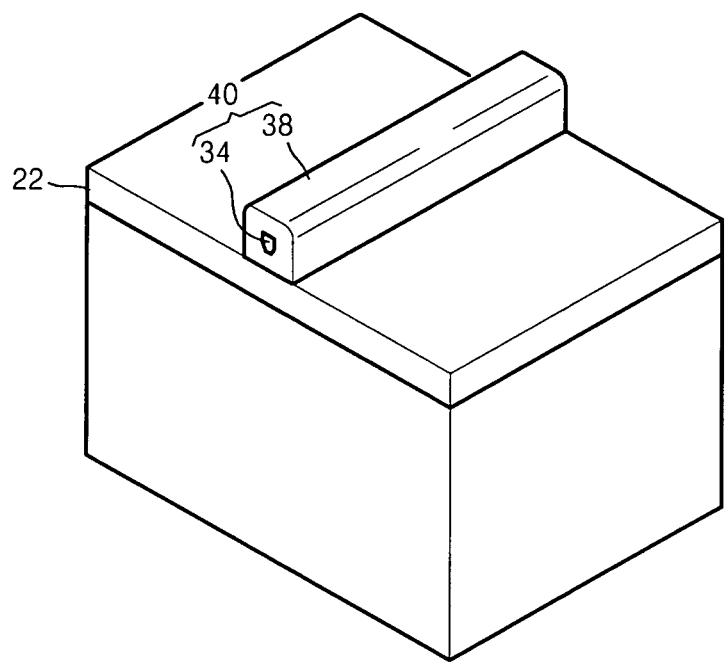
Figure 8:
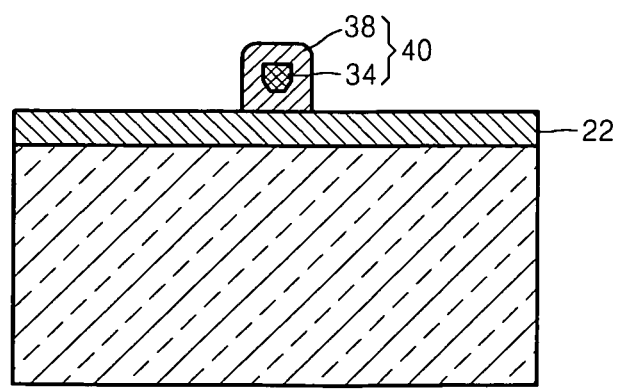

Referring to FIGS. 7 and 8, the core-shell structure 40 of FIG. 7 may be wet-etched. The wet-etching may be performed to process portions of the core-shell structure 40 which may degrade a step coverage of a film which will be formed in a later operation to cover the core-shell structure 40, e.g., to round a sharp edge. Due to the wet-etching, the surfaces of the core-shell structure 40 of FIG. 7, and more particularly, the sharp edges thereof become round with no sharp protrusion.

Figure 9:
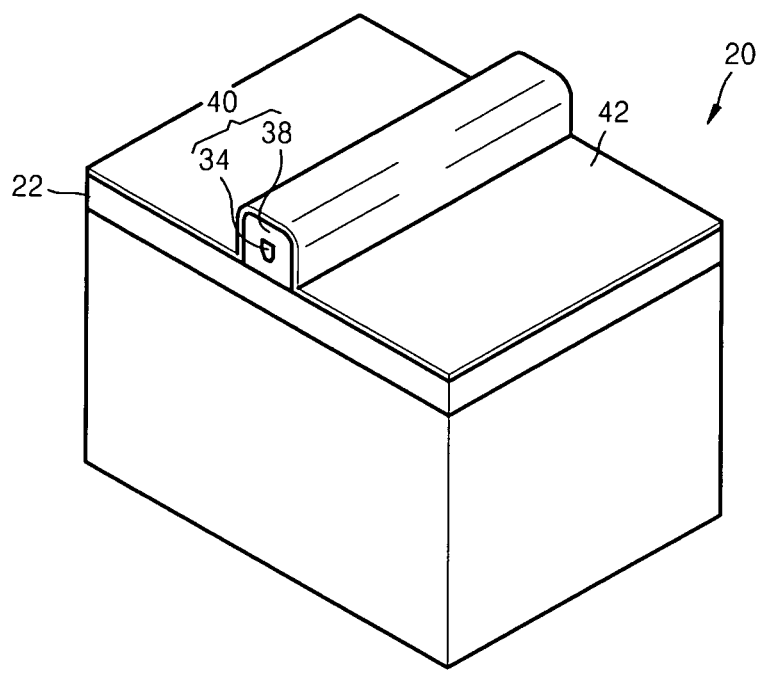
Figure 9:
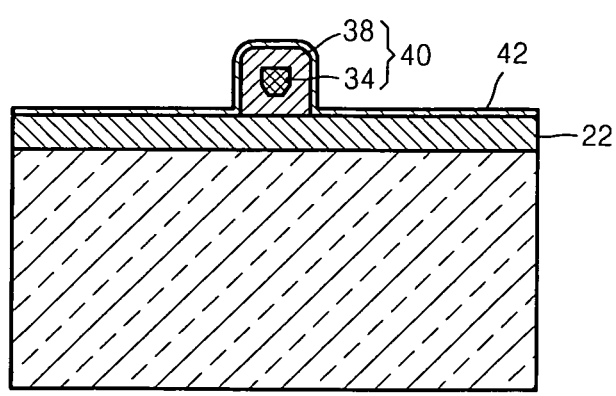

Referring to FIG. 9, an insulation film 42, which covers the wet-etched core-shell structure 40, may be formed on the insulation layer 22. The insulation film 42 may be a silicon oxide layer, but may also be a layer formed of other insulation materials. For example, an insulation material, which is used to form a gate insulation layer in an electric field effect transistor, may be used to form the insulation film 42.

As described above, the core-shell structure 40 can be formed using a combination of various conventional semiconductor device fabricating methods widely used in the prior art, and thus the core-shell structure 40 can be mass-produced. Furthermore, the shape and the location of the core-shell structure 40 may be determined by performing an etching operation using a mask, and thus the core-shell structure 40 having a desired shape can be formed at a desired location.

Figure 10:
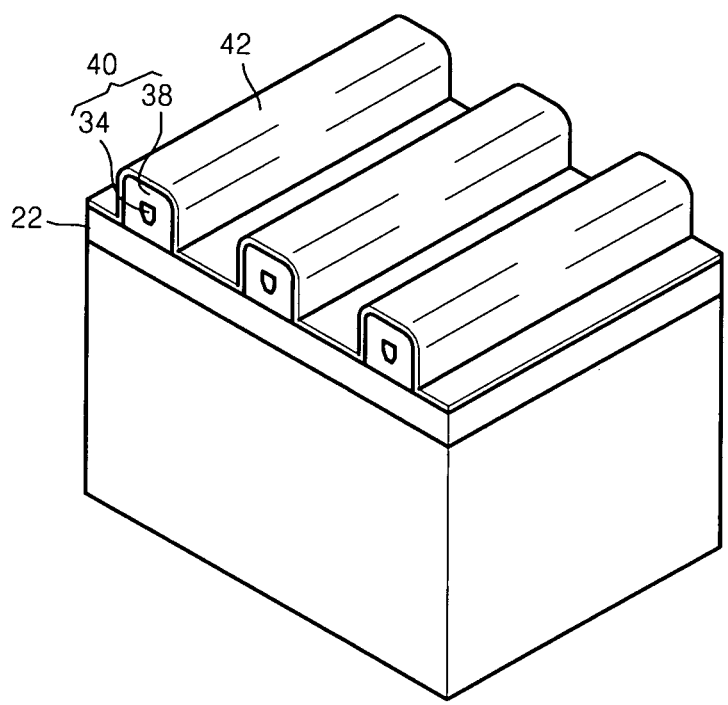
FIG. 10 is a perspective view of an array including a plurality of the core-shell structures according to example embodiments.

During formation of the core-shell structure 40, a plurality of the core-shell structures 40 may be formed in series to form an array. FIG. 10 shows an example of an array including a plurality of the core-shell structures 40. The plurality of core-shell structures 40 may simultaneously be formed according to the method described above in reference to FIGS. 1 through 9.

A method of manufacturing a transistor according to example embodiments, which includes the method of forming the core-shell structure 40 shown in FIGS. 1 through 9, will be described in reference to FIGS. 11 through 22. Like reference numerals refer to the like elements below.

Figure 11:
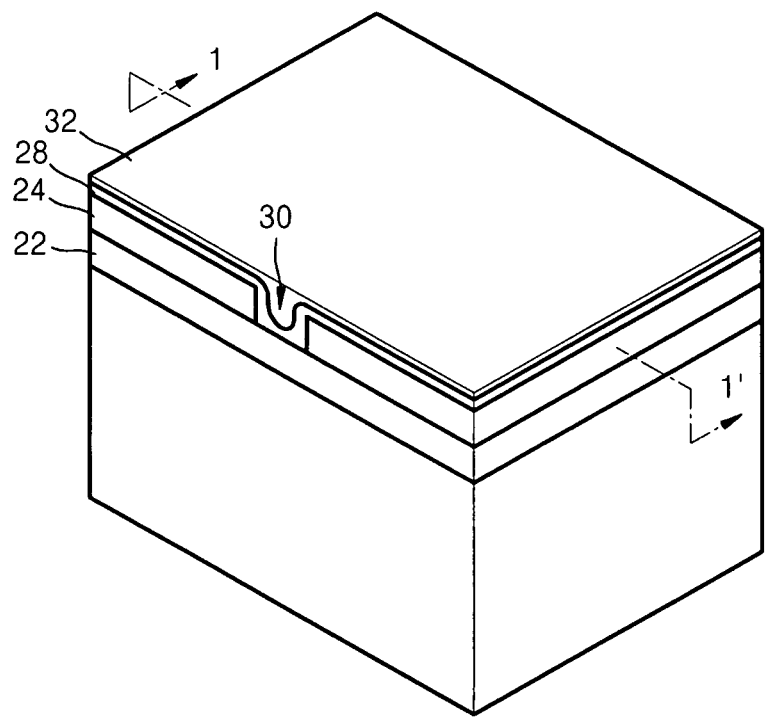
FIGS. 11 through 21 are perspective and cross-sectional views of a method of manufacturing a field effect transistor according to example embodiments, which includes the method of forming the core-shell structure shown in FIGS. 1 through 9.
Figure 11:
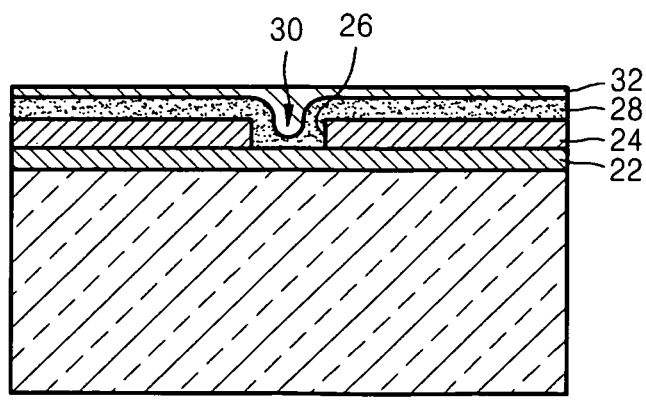

FIG. 11(a) provides a perspective view while FIG. 11(b) provides a cross-sectional view of FIG. 11(a) along line 1-1'. Referring to FIG. 11, the core layer 32 filling the core groove 30 may be formed on the first shell layer 28. Operations until the formation of the core layer 32 may be the same as described above with reference to FIGS. 1 through 4. Thus, the detailed descriptions thereof will be omitted for purposes of brevity.

Figure 12:
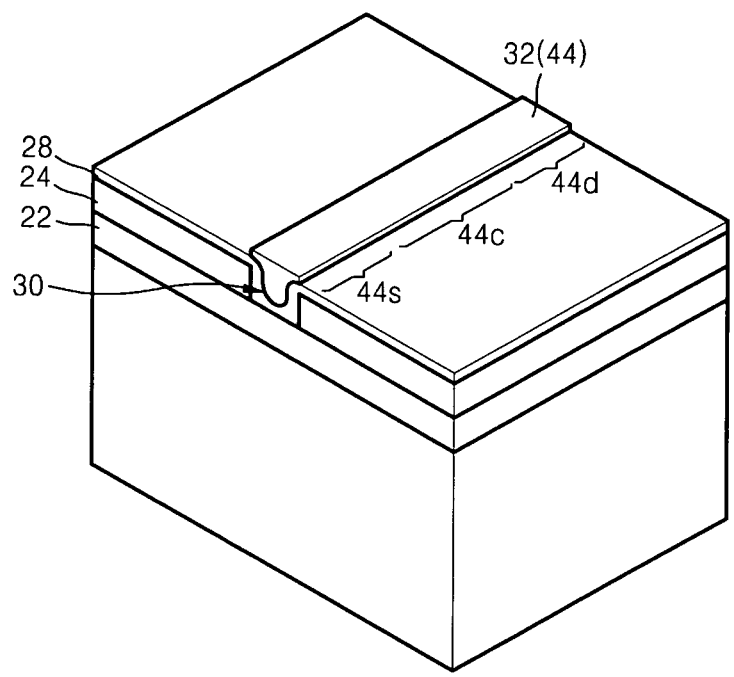

Referring to FIGS. 11 and 12, a first mask (not shown) defining the core groove 30 may be formed on the core layer 32 filling the core groove 30. The first mask may be a photosensitive film pattern. The core layer 32 surrounding the first mask may be etched until the first shell layer 28 is exposed, and the first mask may be removed after the etching operation is completed. The core layer 32 except the portion filling the core groove 30 may be removed. The core layer 32 filled in the core groove 30 will be hereinafter referred to as a core block 44.

Figure 13:
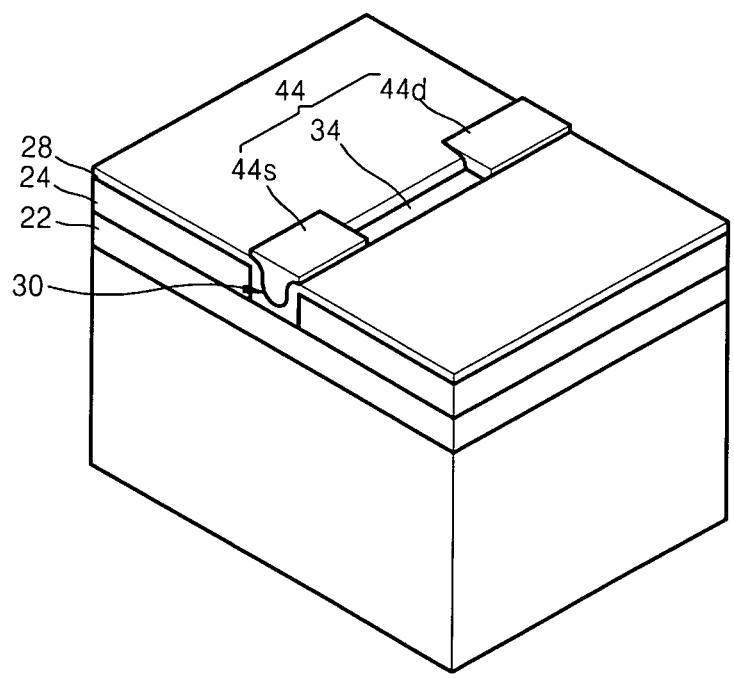
Figure 14:
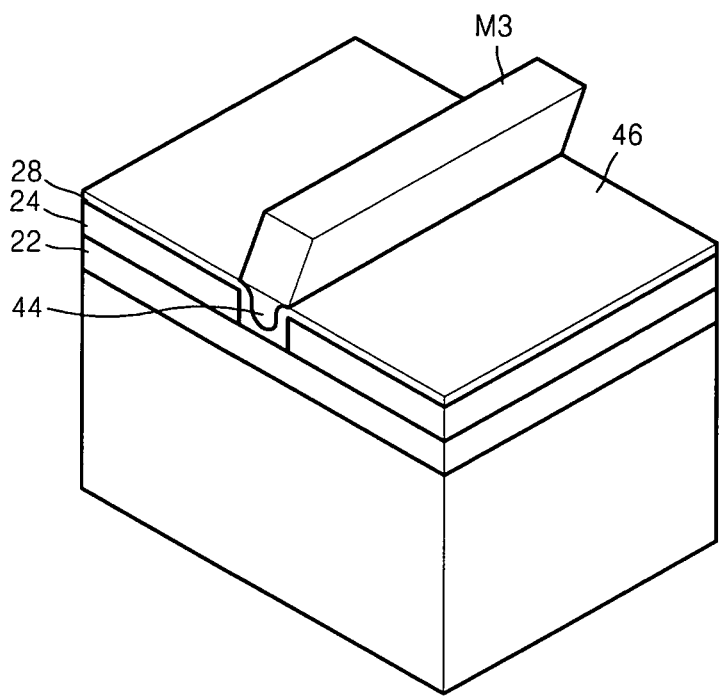

Referring to FIGS. 12 and 13, a second mask (not shown) partially covering the core block 44 may be formed on the first shell layer 28. A region 44c, which will become a channel region (the center region), and regions 44s and 44d, which will respectively become a source region and a drain region (the left end region and right end region) of the core block 44 may be defined by using the second mask. In the core block 44, the region 44c is exposed, whereas the regions 44s and 44d are covered by the second mask. The core block 44 may be etched with the second mask. The etching may be dry-etching, and the second mask may be removed after the etching operation is completed. As a result, an upper portion of an exposed portion of the core block 44 is removed. Each of the top surfaces of the regions 44s and 44d may be relatively larger than the top surface of the region 44c. The operation of processing the region 44c of the core block 44 to the core 34 as shown in FIG. 13 by etching the core block 44 may be the same as the operation of forming the core 34 described with reference to FIG. 5. Referring to FIGS. 13 and 14, a third shell layer 46 covering the core block 44 may be formed on the first shell layer 28. The third shell layer 46 and the first shell layer 28 may be formed of the same material.

Figure 15:
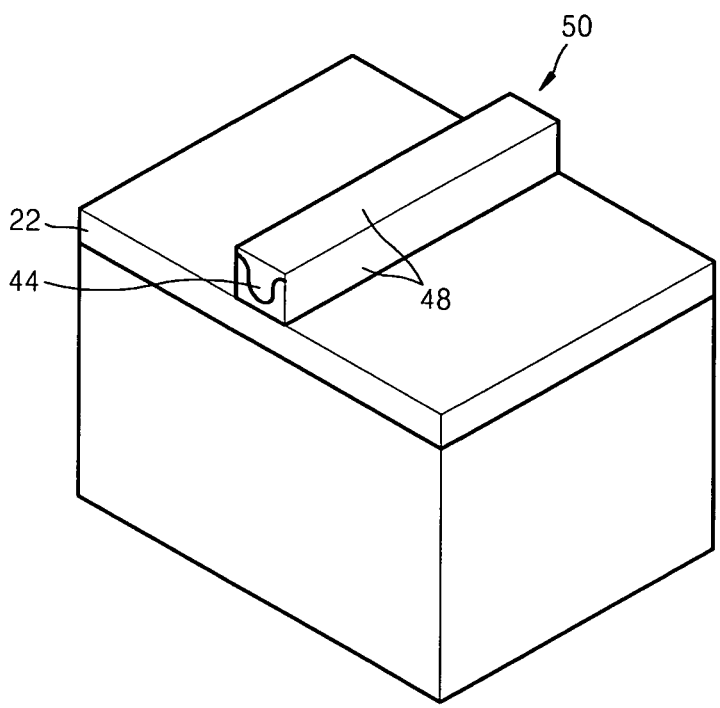

Referring to FIGS. 14 and 15, a third mask M3 is formed on the third shell layer 46. The third mask M3 covers the core block 44 and partially covers portions of the third shell layer 46 surrounding the core block 44. The third shell layer 46, the first shell layer 28, and the silicon layer 24 surrounding the core block 44 may be sequentially etched. The third shell layer 46, the first shell layer 28, and the silicon layer 24 surrounding the core block 44 may be etched until the insulation layer 22 is exposed. After the etching operation is completed, the third mask M3 may be removed. Thus, a structure 50 including the core block 44 and a shell layer 48 surrounding the core block 44 may be formed as shown in FIG. 15. The center portion of the structure 50 may be a core-shell structure including the core 34 and a shell layer 48. The shell layer 48 may include the silicon layer 24, the first shell layer 28, and the third shell layer 46. The third shell layer 46 may constitute the upper portion of the shell layer 48.

Figure 16:
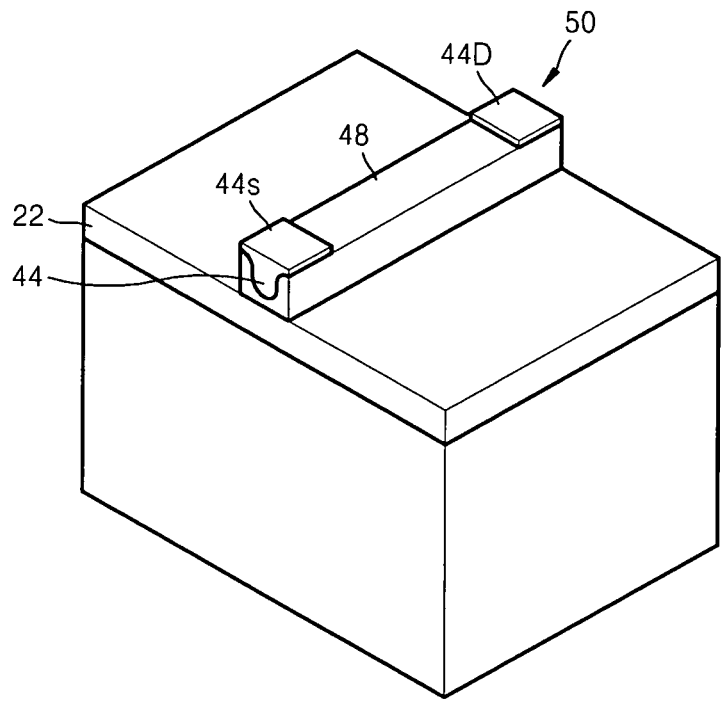

The structure of FIG. 15 may be wet-etched to partially remove the shell layer 48. The wet-etching may be performed using an etchant wherein the etching selectivity is higher with respect to the third shell layer 46 than with respect to the core block 44, e.g., an etchant with a relatively higher etching rate with respect to the third shell layer 46 than with respect to the core block 44. As shown in FIG. 16, the wet-etching may be performed until the regions 44s and 44d, which are regions of the core block 44 used as the source region and the drain region, are exposed. Referring back to FIG. 13, the structure therein has a step between the regions 44s and 44d of the core block 44 and the core 34, which is used as the channel region. Thus, when the third shell layer 46 is formed, the third shell layer 46 is formed thicker on the core 34 than on the regions 44s and 44d. As a result, the thickness of the shell layer 48 is thicker on the core 34 than on the regions 44s and 44d. Thus, the core 34 may not be exposed even though the regions 44s and 44d are exposed in the wet-etching operation. Consequently, a portion including the core 34 in the core block 44 can be maintained as a core-shell structure even after the wet-etching operation is completed.

Figure 17:
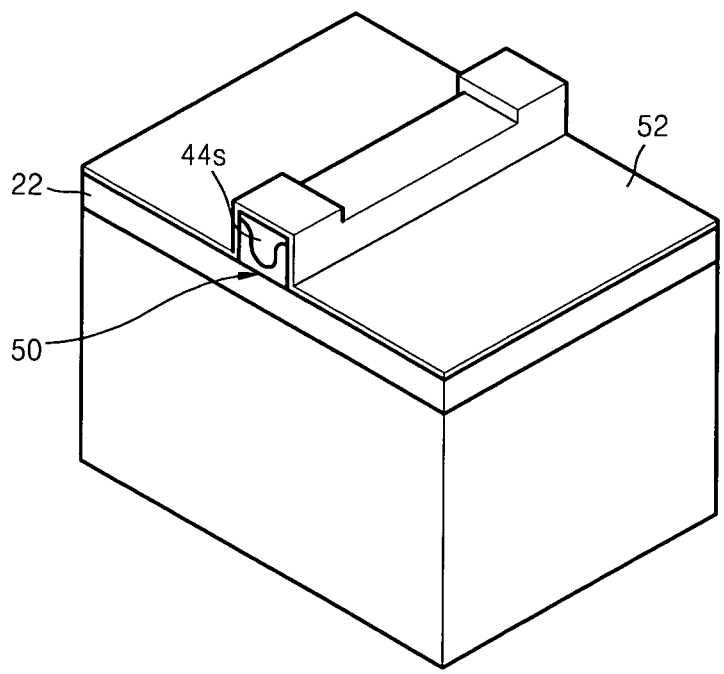

Referring to FIGS. 16 and 17, a gate insulation layer 52 may be formed on the insulation layer 22. The gate insulation layer 52 may be formed to cover the structure 50 having the regions 44s and 44d, which is exposed by the wet-etching operation. For convenience of explanation, the regions 44s and 44d of the core block 44 will be hereinafter indicated as a source region 44s and a drain region 44d, respectively.

Figure 18:
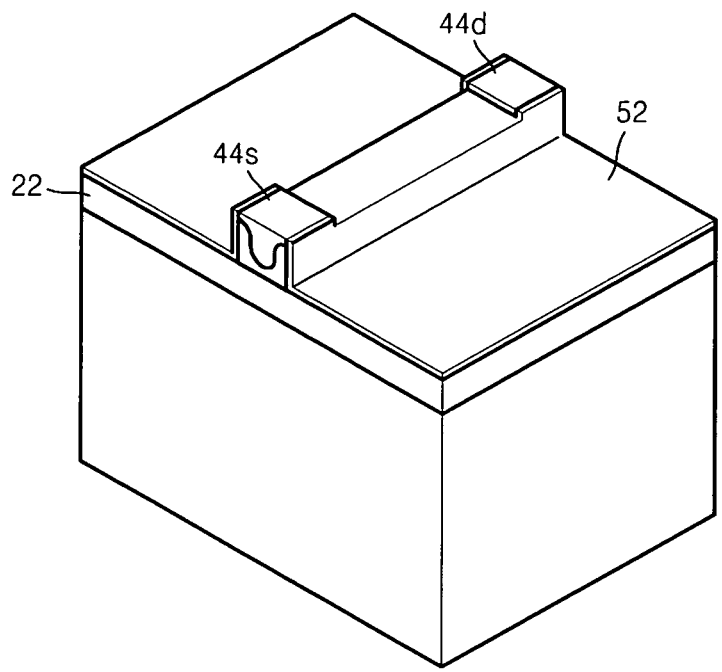

Referring to FIG. 18, the gate insulation layer 52 on the source region 44s and the drain region 44d may be removed. The operation of removing of the gate insulation layer 52 on the source region 44s and the drain region 44d may be performed with relative ease using a masking process and an etching process according to a conventional method of manufacturing a semiconductor device.

Figure 19:
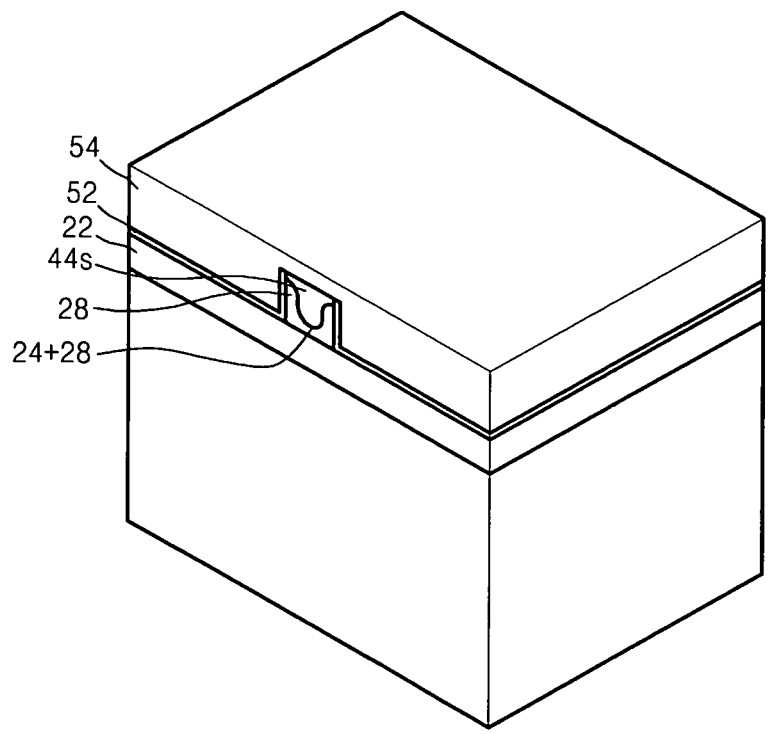

Referring to FIGS. 18 and 19, an interlayer insulation layer 54, which covers the structure 50 in which the source region 44s and the drain region 44d are exposed, may be formed on the gate insulation layer 52.

Figure 20:
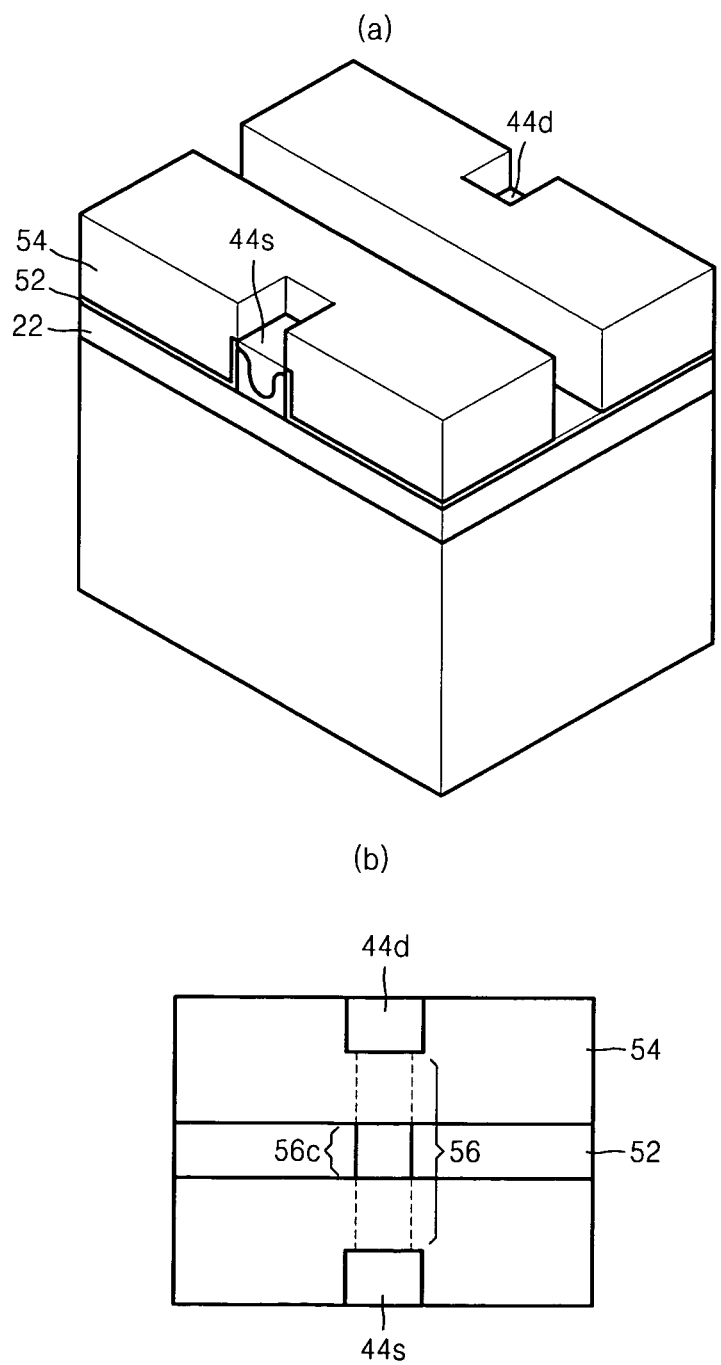

Referring to FIG. 20, the interlayer insulation layer 54 may be etched to remove a portion of the interlayer insulation layer 54 on the top surface of the source region 44s and the drain region 44d of the structure 50. A portion of the interlayer insulation layer 54, which may have a predetermined width and extends across the channel region between the source region 44s and the drain region 44d, may also be removed to expose the gate insulation layer 52. Accordingly, the top surfaces of the source region 44s and the drain region 44d may be exposed, and a portion 56c of a channel region 56 connecting the source region 44s and the drain region 44d may be exposed, wherein the portion 56c may be the portion actually used as a channel. The exposed portion 56c of the channel region 56 may be apart from the source region 44s and the drain region 44d. The interlayer insulation layer 54 may be etched using a masking process and an etching process according to a conventional method of manufacturing a semiconductor device. FIG. 20(a) is a perspective view, and FIG. 20(b) is a plan view of FIG. 20(a).

Figure 21:
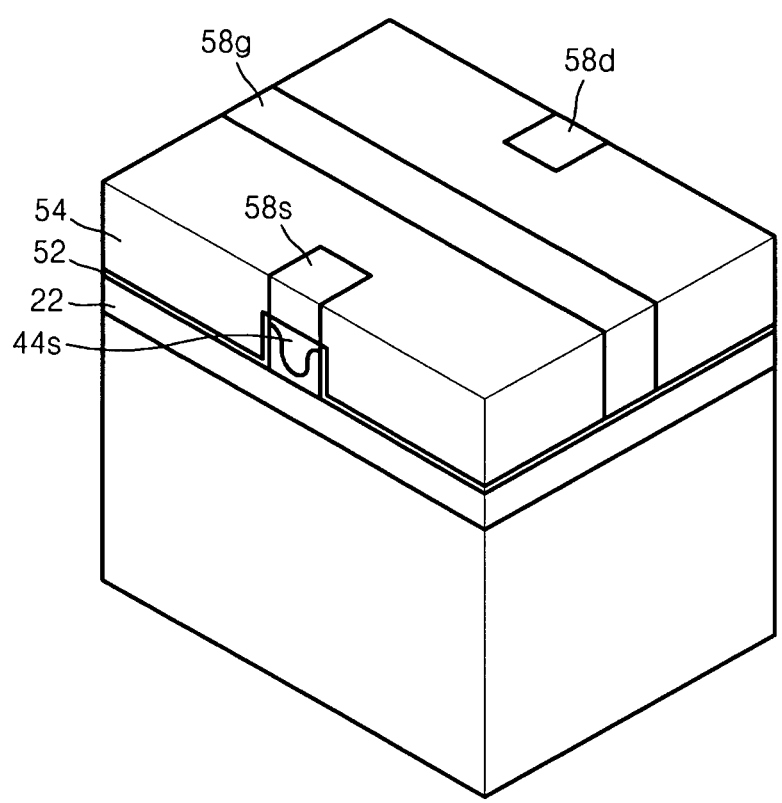
Figure 22:
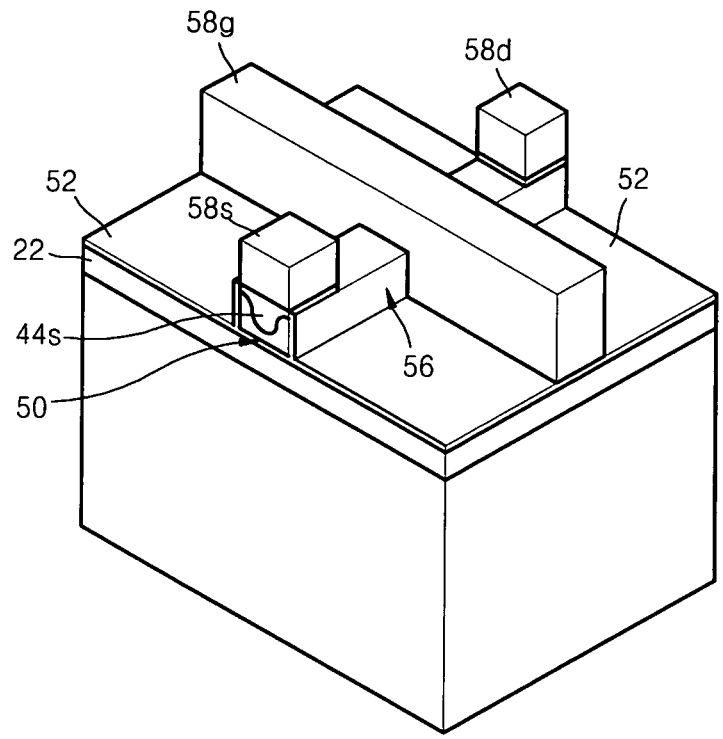
FIG. 22 is a perspective view of the structure shown in FIG. 21, wherein an interlayer insulation layer is removed.

Referring to FIGS. 20 and 21, a conductive layer (not shown), which contacts the source region 44s, the drain region 44d, and the portion 56c of the channel region 56 may be formed on the interlayer insulation layer 54. The top surface of the conductive layer may be planarized until the top surface of the interlayer insulation layer 54 is exposed. As a result, a source electrode 58s and a drain electrode 58d, which respectively contact the source region 44s and the drain region 44d, and a gate electrode 58g, which completely covers the region 56c of the channel region 56, may be formed. The source region 44s, the drain region 44d, the channel region 56, and the gate electrode 58g may form an electric field effect transistor. FIG. 22 shows the structure shown in FIG. 21 from which the interlayer insulation layer 54 has been removed.

Another method of forming a core-shell structure according to example embodiments will be described below in reference to FIGS. 23 through 30. Like reference numerals refer to the like elements below, and detailed descriptions of the like elements will be omitted for purposes of brevity.

Figure 23:
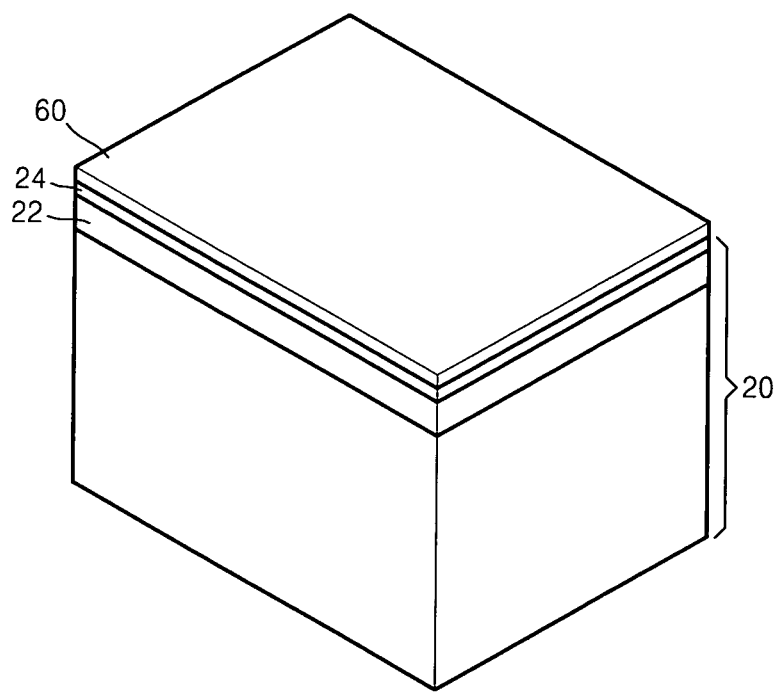
FIGS. 23 through 30 are perspective and cross-sectional views of another method of forming a core-shell structure according to example embodiments.

Referring to FIG. 23, a core layer 60 may be deposited onto the silicon layer 24 of the SOI substrate 20. The silicon layer 24 may function as the first shell layer 28 of FIG. 3. Furthermore, the core layer 60 may be formed of the same material as the core layer 32 of FIG. 4.

Figure 24:
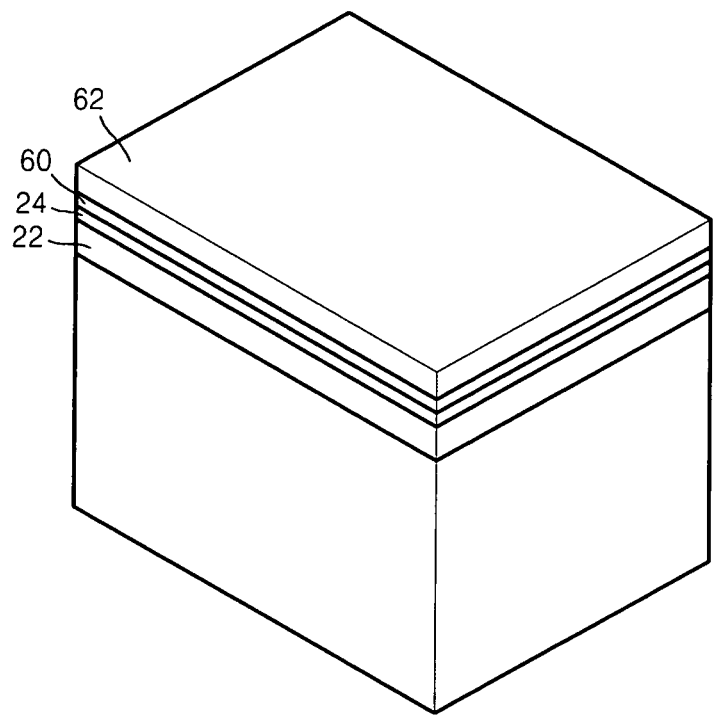

Referring to FIG. 24, a shell layer 62 may be formed on the core layer 60. Because the silicon layer 24 may function as the first shell layer, the shell layer 62 will be hereinafter referred to as the second shell layer 62. The second shell layer 62 may be formed of the same material as the second shell layer 36 of FIG. 6.

Figure 25:
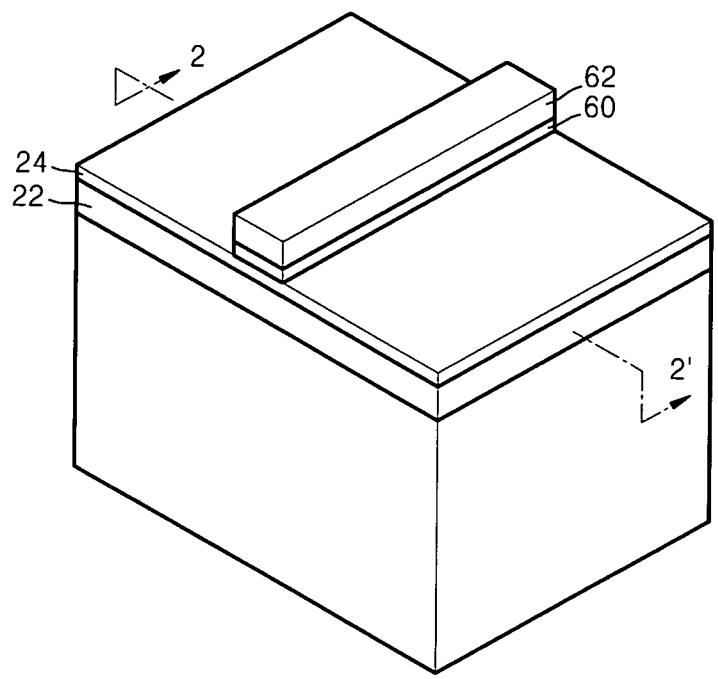
Figure 25:
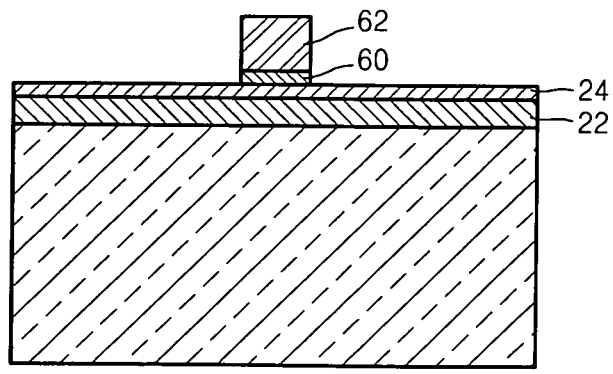

Referring to FIGS. 24 and 25, a linear shaped mask (not shown) having a predetermined width may be formed on the second shell layer 62. The second shell layer 62 and the core layer 60 surrounding the mask may be sequentially etched. The second shell layer 62 and the core layer 60 surrounding the mask may be etched until the silicon layer 24 is exposed. After the etching operation is completed, the mask is removed. As a result, a stacked structure of the core layer 60 and the second sell layer 62, which are stacked in the shape of a line with a predetermined width, may be formed on the silicon layer 24. In each of FIGS. 25 to 30, illustration (b) is a cross-sectional view obtained along a line 2-2' of illustration (a).

Figure 26:
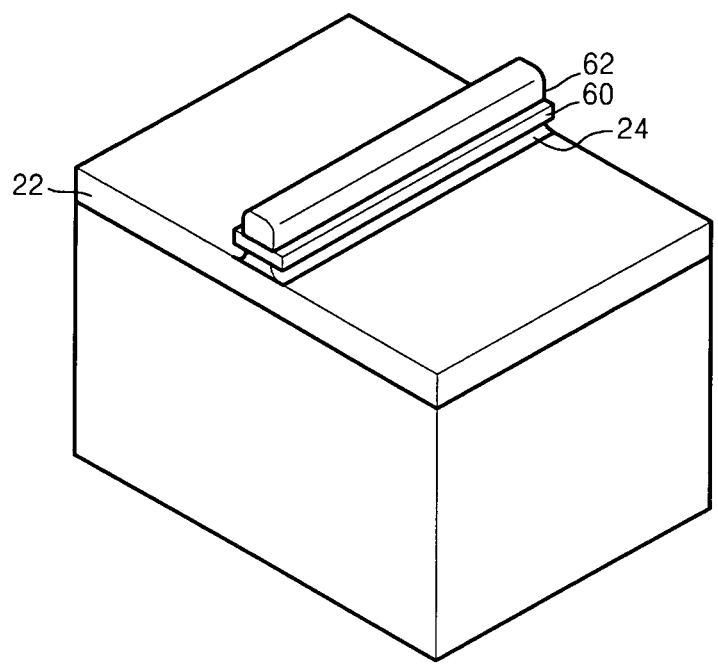
Figure 26:
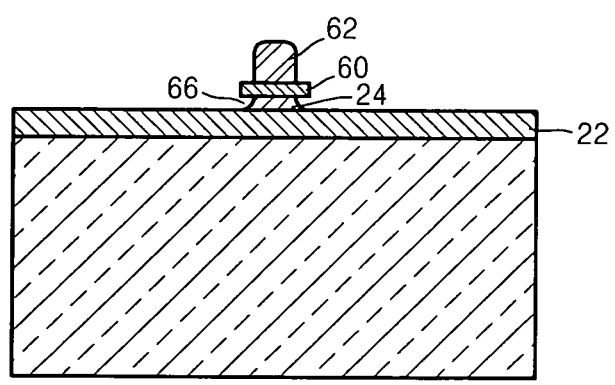

The resultant structure of FIG. 25 may be wet-etched (hereinafter referred to as a first wet-etching). The first wet-etching operation may be performed with respect to the silicon layer 24 and the second shell layer 62. Therefore, the first wet-etching operation may be performed using an etchant of which etching selectivity is higher with respect to the silicon layer 24 and the second shell layer 62 than with respect to the core layer 60, e.g., an etchant with a relatively higher etching rate with respect to the silicon layer 24 and the second shell layer 62 than with respect to the core layer 60. The first wet-etching operation may be performed until the silicon layer 24 surrounding the core layer 60 is removed. The first wet-etching operation may be performed to expose the top surface of the insulation layer 22 of the SOI substrate 20. The second shell layer 62 may be a silicon layer. Therefore, the second shell layer 62 may be etched in the first wet-etching operation. As shown in FIG. 26, the first wet-etching may be performed until the widths of the silicon layer 24 and the second shell layer 62 are smaller than that of the core layer 60. Thus, an under-cut 66 may be formed below the core layer 60.

Figure 27:
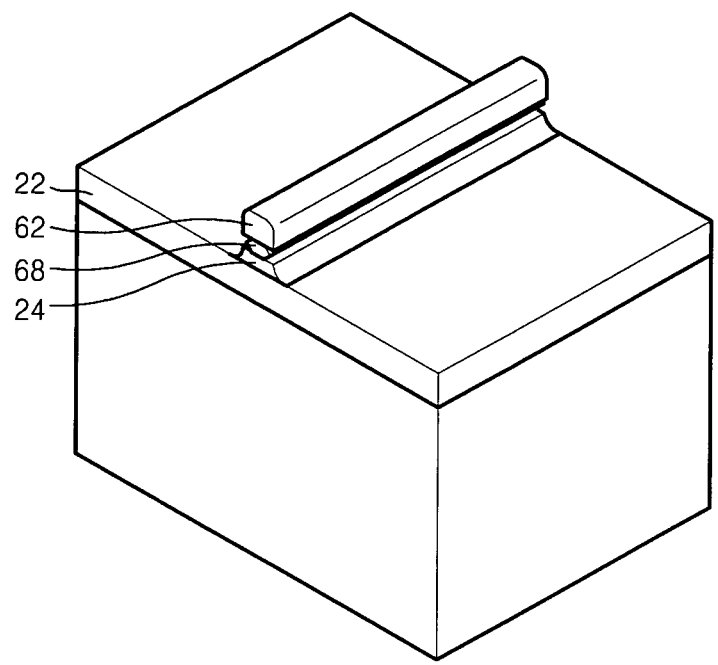
Figure 27:
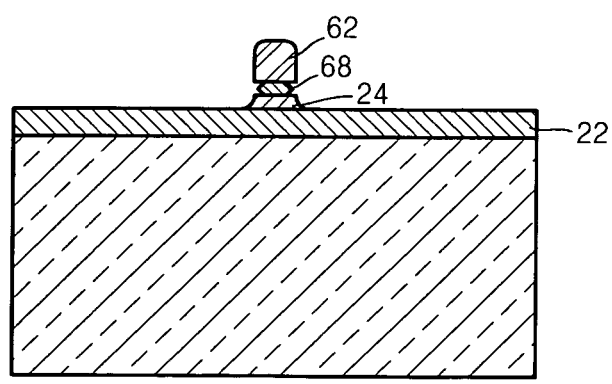

The resultant structure of FIG. 26 may be wet-etched (hereinafter referred to as a second wet-etching). The second wet-etching operation may be performed with respect to the core layer 60. The second wet-etching operation may be performed using an etchant with a relatively higher etching rate with respect to the core layer 60 than with respect to the silicon layer 24 and the second shell layer 62. The second wet-etching operation may be performed until the width of the core layer 60 is smaller than those of the silicon layer 24 and the second shell layer 62. Through the second wet-etching operation, the core layer 60 may be processed to have a size of the core of a core-shell structure. FIG. 27 shows a result of the second wet-etching operation.

Referring to FIG. 27, the silicon layer 24 and the second shell layer 62 may be stacked on the insulation layer 22 in a linear shape. A core 68, which may be formed by the second wet-etching process, exists between the silicon layer 24 and the second shell layer 62. As shown in illustration (b) of FIG. 27, it is clear that the width of the core 68 may be smaller than those of the silicon layer 24 and the second shell layer 62.

Figure 28:
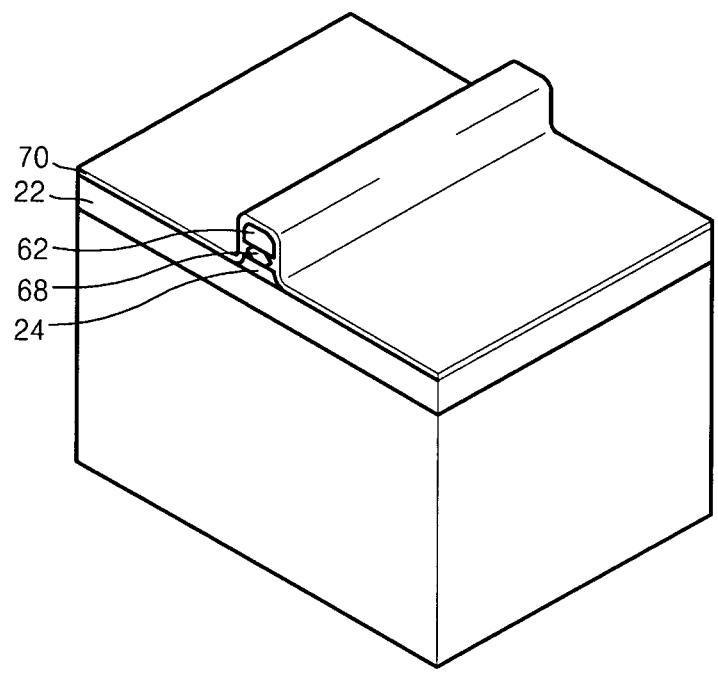
Figure 28:
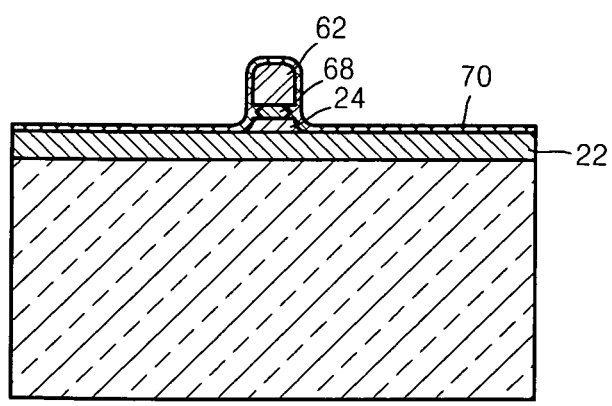
Figure 29:
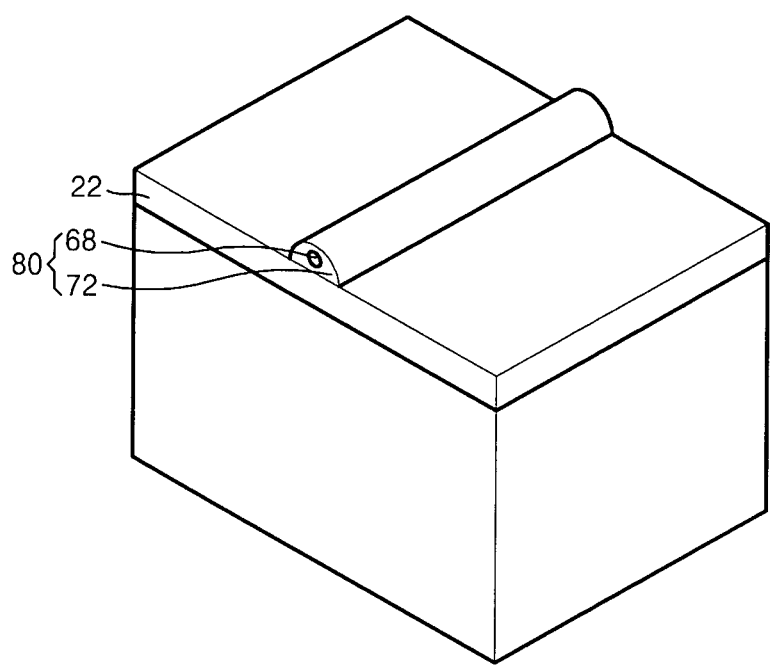
Figure 29:
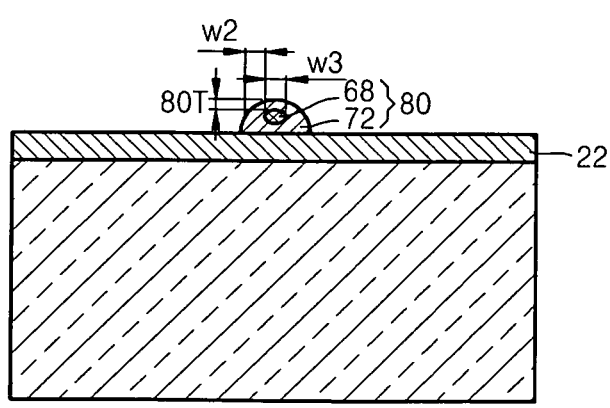

Referring to FIGS. 27 and 28, a third shell layer 70 may be formed on the insulation layer 22. The third shell layer 70 may be formed to cover a stacked structure (hereinafter referred to as a first stack structure) formed on the insulation layer 22 of FIG. 27. The third shell layer 70 may be formed of the same material as the first shell layer 28 of FIG. 3. When the third shell layer 70 is formed, a space between the silicon layer 24 and the second shell layer 62 of the first stack structure surrounding the core 68 may be filled by the third shell layer 70. As a result, the core 68 may be surrounded by the silicon layer 24, the second shell layer 62, and the third shell layer 70, as shown in FIG. 28. After the third shell layer 70 is formed, the third shell layer 70 on the insulation layer 22 surrounding the first stacked structure may be removed. Thus, as shown in FIG. 29, a core-shell structure 80 including the core 68 and a shell 72 may be formed on the insulation layer 22. The shell 72 may be formed of the silicon layer 24, the second shell layer 62, and the third shell layer 70.

Figure 30:
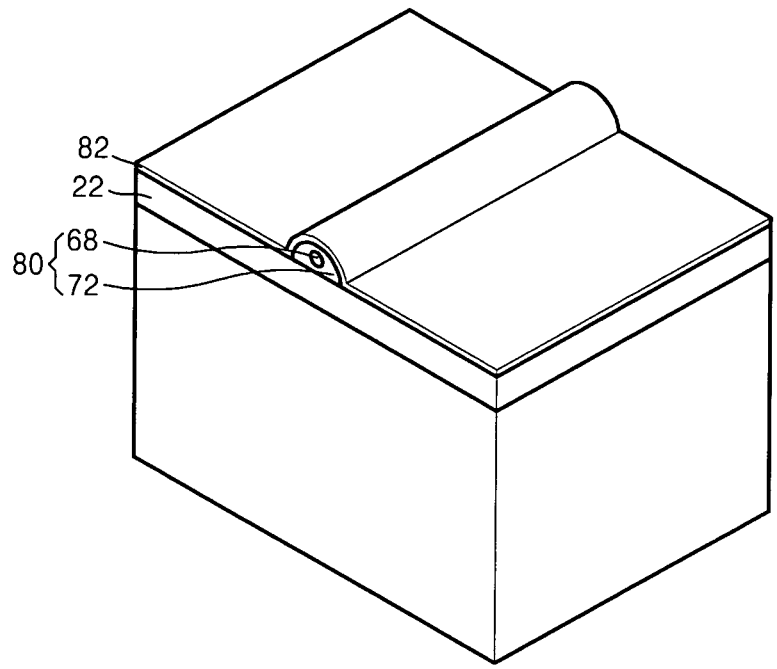
Figure 30:
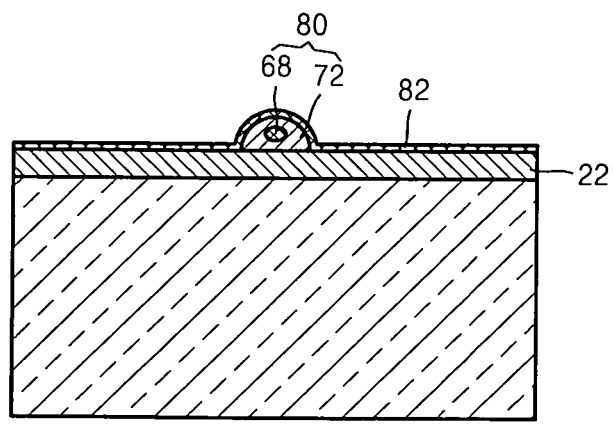

Referring to FIG. 30, an insulation layer 82 covering the core-shell structure 80 may be formed on the insulation layer 22. Referring back to FIG. 29, the thickness W2 of a side surface of the shell 72 in the core-shell structure 80 may be determined through the second wet-etching operation to obtain the resultant structure of FIG. 27 and the operation of depositing the third shell layer 70 in FIG. 28. Thus, the thickness W2 of a side surface of the shell 72 may be adjusted by controlling the second wet-etching operation and the operation of depositing the third shell layer 70. Furthermore, the thickness 80T of the shell 72 above the core 68 in the core-shell structure 80 may be determined through the operation of depositing the second shell layer 62 in FIG. 24, the first wet-etching operation to obtain the resultant structure of FIG. 26, the operation of depositing the third shell layer 70 of FIG. 28, and the etching operation to obtain the resultant structure of FIG. 29. Therefore, the thickness 80T of the portion of the shell 72 above the core 68 may also be adjusted to a desired thickness by controlling the operations above. Furthermore, the diameter W3 of the core 68 may be determined through the second wet-etching operation to obtain the resultant operation of FIG. 27. Thus, the diameter W3 of the core 68 may be adjusted by controlling the operations above.

FIGS. 31 through 35 are cross-sectional views of a method of forming a core-shell structure according to a modification of the method shown in FIGS. 1 through 9. In the method shown in FIGS. 31 through 35, the silicon layer 24 of a SOI substrate may be used as the first shell layer 28 of FIG. 3. The substrate used in FIGS. 31 through 35 may be the same as the SOI substrate 20 shown in FIG. 1, wherein the bottommost layer of the SOI substrate 20 has not been shown for simplicity. Like reference numerals refer to the like elements below, and detailed descriptions of the like elements have been omitted for purposes of brevity.

Figure 31:
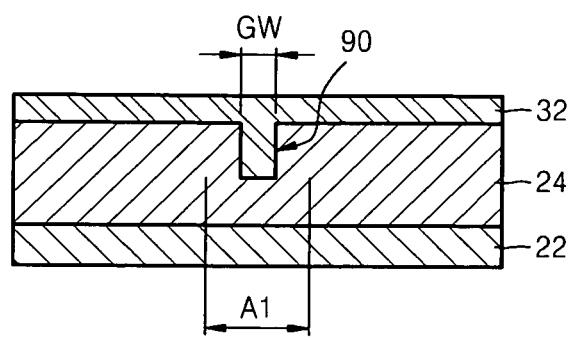
FIGS. 31 through 35 are cross-sectional views of a method of forming a core-shell structure according to a modification of the method shown in FIGS. 1 through 9.
Figure 32:
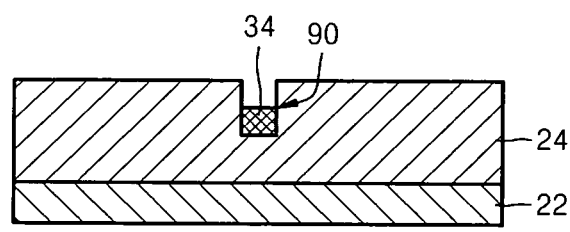

Referring to FIG. 31, a region A1 of the silicon layer 24, in which the core-shell structure will be formed, is determined. A groove 90 may be formed in the region A1 of the silicon layer 24. The width GW of the groove 90 may be smaller than the width W1 of the groove 26 of FIG. 2. The core layer 32, which fills the groove 90, may be formed on the silicon layer 24. The core layer 32 may be dry-etched anisotropically. The dry-etching may be continuously performed even after the top surface of the silicon layer 24 is exposed and until only a portion of the core layer 32 filled in the groove 90 remains. As a result, the core 34 may be formed in the groove 90 as shown in FIG. 32.

Figure 33:
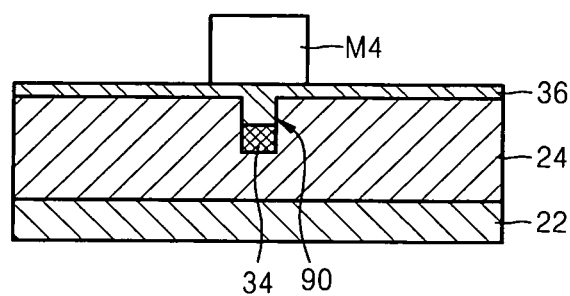
Figure 34:
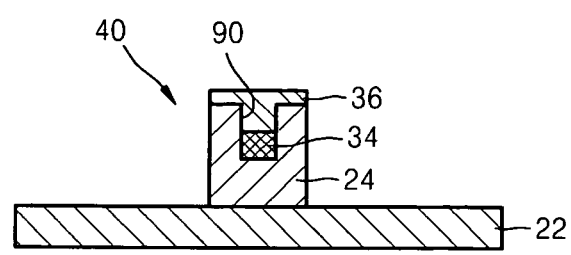
Figure 35:
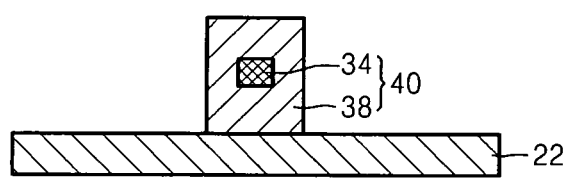

Referring to FIG. 33, a second shell layer 36 filling the remaining regions of the groove 90 partially filled with the core 34, may be formed on the silicon layer 24. A mask M4, which defines a region in which the core-shell structure will be formed (A1 of FIG. 31), may be formed on the second shell layer 36. The mask M4 may be a photosensitive film pattern. The second shell layer 36 and the silicon layer 24 surrounding the mask M4 may be sequentially etched. The mask M4 may be removed after the etching. Thus, as shown in FIG. 34, the core-shell structure 40, which includes the core 34 and the silicon layer 24 and the second shell layer 36 surrounding the core 34, may be formed on the insulation layer 22. Because both of the silicon layer 24 and the second shell layer 36 may be layers formed of silicon, the two layers may be indicated as a single layer. Therefore, the core-shell structure 40 of FIG. 34 may be represented as including the core 34 and the shell 38 as shown in FIG. 35. After the core-shell structure 40 is formed, the operations shown in FIGS. 8 and 9 may be performed. An array of core-shell structures as shown in FIG. 10 may also be formed in the operations shown in FIGS. 31 through 35.

As described above according to example embodiments, a core-shell structure having a desired shape may be formed at a desired location using a mass-production top-down type method of manufacturing a semiconductor device. Because sufficient mass productivity of a core-shell structure can be secured, the core-shell structure may be commercialized. Thus, a semiconductor device including a core-shell structure as one of its components, e.g. a transistor, may be commercialized.

It should be understood that the non-limiting examples described therein are merely for purposes of illustration. For example, the method of forming a core-shell type structure shown in FIGS. 23 through 30 may be used in a method of forming an electric field-effect transistor. Furthermore, a core-shell structure in which the shell includes a plurality of layers may be formed by interposing a buffer layer. Thus, the descriptions of features or aspects of one instance should be understood as being available for other appropriate instances.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of forming a core-shell structure, comprising:
defining a core-shell region on a substrate, the core-shell region being an area where the core-shell structure will be formed;
forming a core in the core-shell region of the substrate by forming a core layer on the substrate and removing a portion of the core layer, wherein the core is a line-shape and a portion of a surface of the core between both ends of the core is exposed and the core is spaced away from the substrate; and
forming an upper shell layer in the core shell region, the upper shell layer covering the entire portion of the surface exposed of the core,
wherein the core and the upper shell layer are consecutively formed.

2. The method of claim 1, further comprising, forming a lower shell layer between the substrate and the core.

3. The method of claim 2, wherein forming the core and the upper shell layer includes:
forming a groove in the substrate;
forming the lower shell layer on the substrate such that the lower shell layer covers surfaces of the groove to form a coated groove; and
forming the core in the coated groove.

4. The method of claim 3, wherein forming the core includes:
forming the core layer on the lower shell layer so as to fill the coated groove; and
removing the core layer so as to leave a portion of the core layer in the coated groove.

5. The method of claim 3, further comprising:
sequentially etching the upper shell layer, the lower shell layer, and a silicon layer of the substrate to form a core-shell structure, wherein the substrate is a silicon-on-insulator (SOI) substrate and the groove is formed in the silicon layer.

6. The method of claim 5, further comprising:
removing sharp corners of the core-shell structure.

7. The method of claim 3, wherein a thickness of the lower shell layer is about one-third of a width of the groove.

8. The method of claim 1, wherein forming the core and the upper shell layer includes:
forming a groove in the substrate;
forming the core in the groove.

9. The method of claim 8, wherein forming the core includes:
forming the core layer on the substrate so as to fill the groove; and
removing the core layer so as to leave a portion of the core layer in the groove.

10. The method of claim 8, further comprising:
sequentially etching the upper shell layer and a silicon layer of the substrate to form a core-shell structure, wherein the substrate is a SOI substrate and the groove is formed in the silicon layer.

11. The method of claim 8, wherein a width of the groove is equal to a width of the core.

12. The method of claim 1, further comprising:
forming a mask on the upper shell layer, the mask being larger than the core-shell region;
removing the upper shell layer and the core layer surrounding the mask; and
removing the mask.

13. The method of claim 12, further comprising:
reducing a width of a silicon layer of the substrate and a width of the upper shell layer, wherein the substrate is a SOI substrate and the reduced widths of the upper shell layer and the silicon layer are greater than a diameter of the core and smaller than the width of the core layer.

14. The method of claim 13, wherein the core is formed from the core layer after the width of the silicon layer and the width of the upper shell layer are reduced.

15. The method of claim 13, further comprising:
covering exposed surfaces of the core with an outer shell layer.

16. The method of claim 1, wherein the core and the shell of the core-shell structure are respectively formed of Ge and Si, GaAs and InGaAs, or InAs and InP.

17. A method of manufacturing a semiconductor device having a core-shell structure, comprising:
forming a groove in a substrate;
filling the groove with a core layer;
defining contiguous first, second, and third regions on the core layer and etching the second region of the core layer to form a core;
forming the core-shell structure including the core, wherein the first region, the third region and the core are surrounded by a shell layer; and
exposing top surface of the first and third regions of the core layer.

18. The method of claim 17, further comprising, after exposing top surfaces of the first and third regions:
forming an insulation layer to cover the core-shell structure while leaving the first and third regions of the core layer exposed; and
forming an electrode which covers at least a portion of the second region, on the insulation layer and forming electrodes on the top surfaces of the first and third regions.

19. The method of claim 17, wherein forming the core-shell structure includes:
forming a top shell layer to cover the core layer having the core;
forming a mask to define a region on the top shell layer where the core-shell structure will be formed;
removing the top shell layer and a silicon layer of the substrate surrounding the mask, the substrate being a SOI substrate;
removing the mask; and
removing the top shell layer on the first and third regions.

20. The method of claim 17, wherein the semiconductor device is an electric field-effect transistor in which the core surrounded by the shell layer operates as a channel.

* * * * *